(12) United States Patent
Ogura et al.

(10) Patent No.: US 6,516,430 B1
(45) Date of Patent: Feb. 4, 2003

(54) TEST CIRCUIT FOR SEMICONDUCTOR DEVICE WITH MULTIPLE MEMORY CIRCUITS

(75) Inventors: Kiyonori Ogura, Kasugai (JP); Eisaku Itoh, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/461,403

(22) Filed: Dec. 15, 1999

(30) Foreign Application Priority Data

Jun. 29, 1999 (JP) .......................................... 11-183476

(51) Int. Cl.[7] .............................................. G11C 29/00
(52) U.S. Cl. ........................ 714/719; 714/718; 714/733
(58) Field of Search .......................... 365/189.04, 200; 714/720, 718, 719, 733

(56) References Cited

U.S. PATENT DOCUMENTS

| | | | | |
|---|---|---|---|---|
| 5,576,997 A | * | 11/1996 | Masuda et al. | 365/189.04 |
| 5,724,367 A | * | 3/1998 | Osawa et al. | 714/720 |
| 6,025,733 A | * | 2/2000 | Saitoh et al. | 324/763 |
| 6,195,771 B1 | * | 2/2001 | Tanabe et al. | 714/718 |
| 6,233,182 B1 | * | 5/2001 | Satou et al. | 365/200 |

* cited by examiner

Primary Examiner—David Ton
(74) Attorney, Agent, or Firm—Arent Fox Kintner Plotkin & Kahn PLLC

(57) ABSTRACT

A semiconductor device having multiple memory circuits and one or more logic sections includes a single test circuit for testing all of the memory circuits. The test circuit includes a test section that controls the memory circuits, for example, by initiating a read operation, with a control signal. Comparison/determination circuits, which correspond to the memory circuits, compare the data read from the memory circuits with expected value data, and generate determination signals. Since the various memory circuits are different distances (wire lengths) from the test section, a control section is provided which adds a delay to the control signal provided to the various memory circuits so that the memory circuits all receive the control signal at about the same time and perform their respective read operations at the same time.

30 Claims, 17 Drawing Sheets

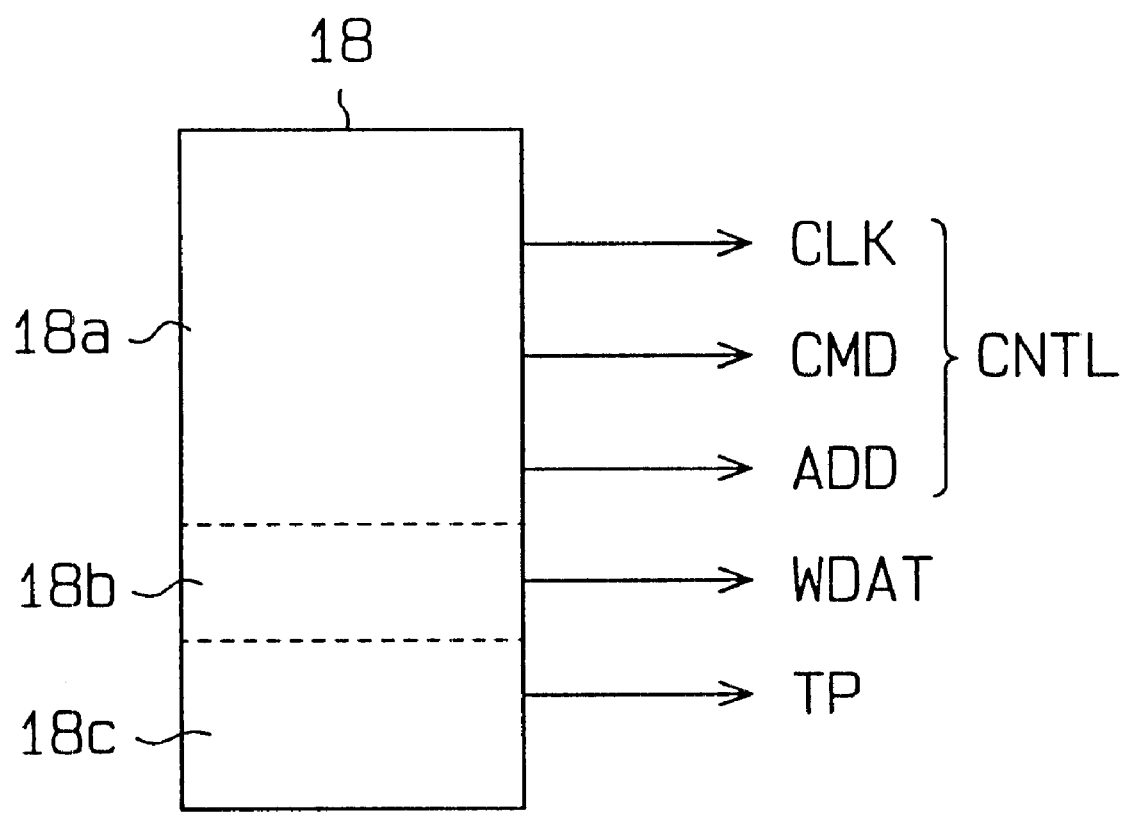

Fig. 9
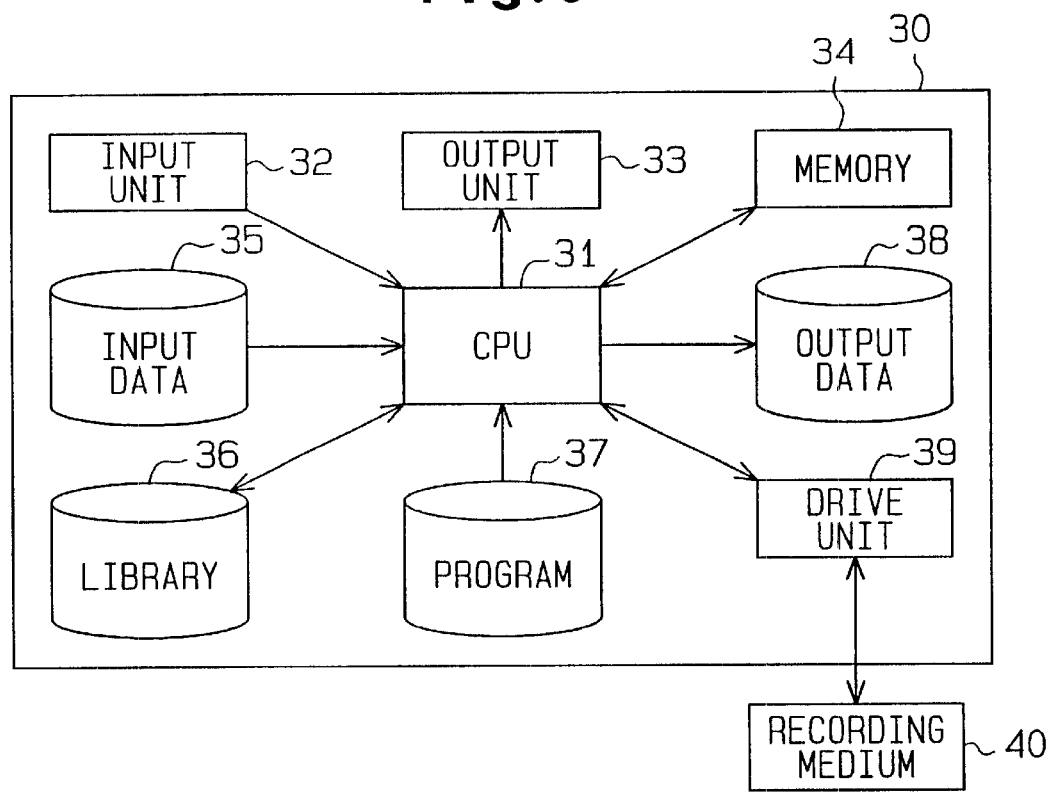
Fig. 10(a)   Fig. 10(b)   Fig. 10(c)
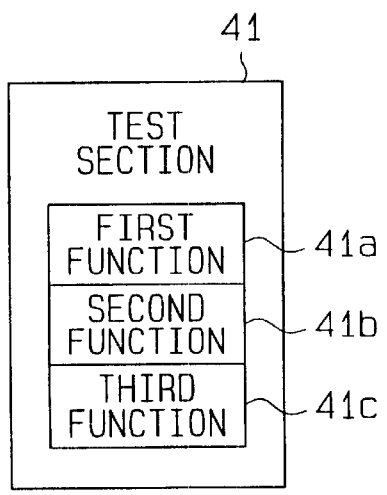 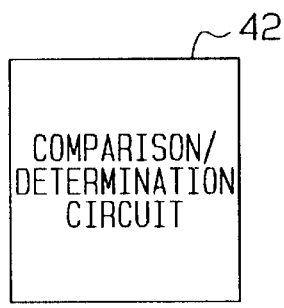 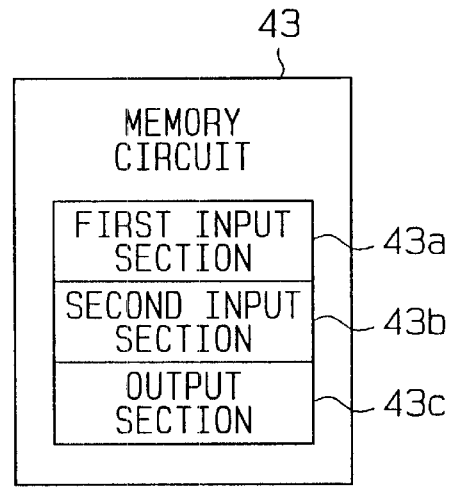

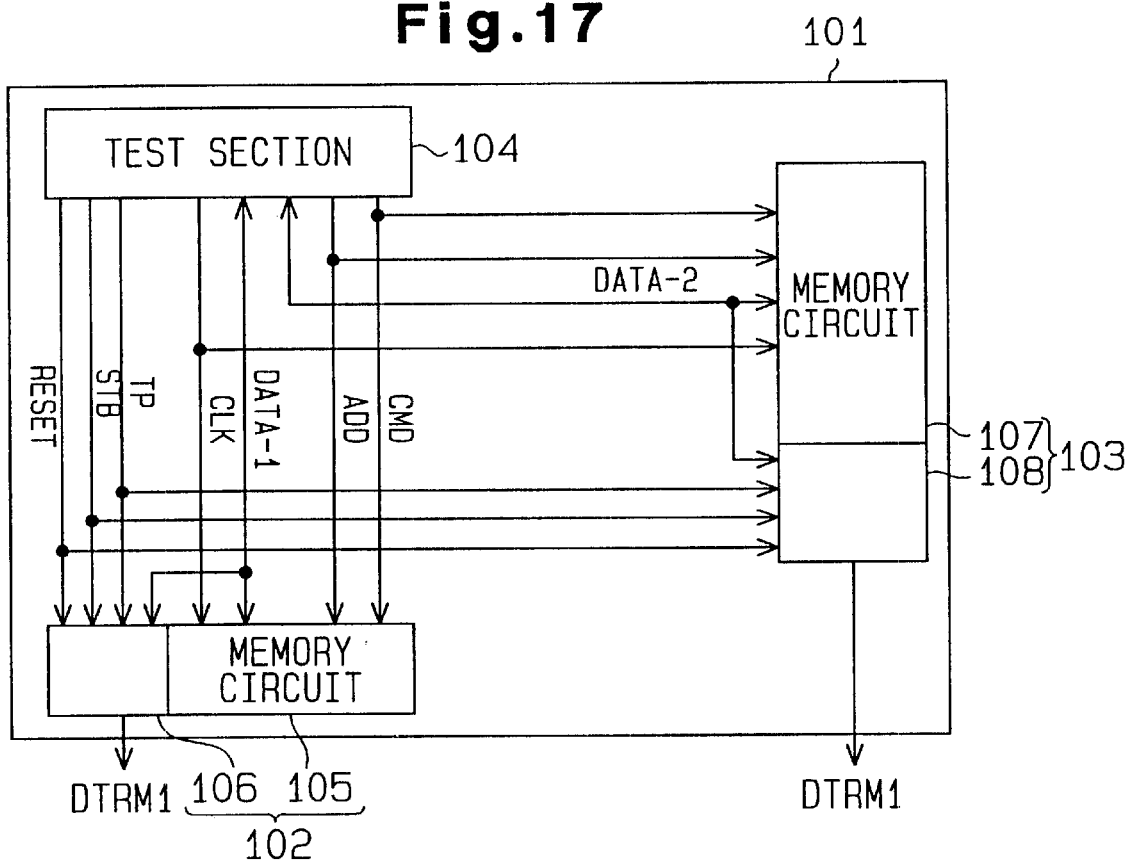
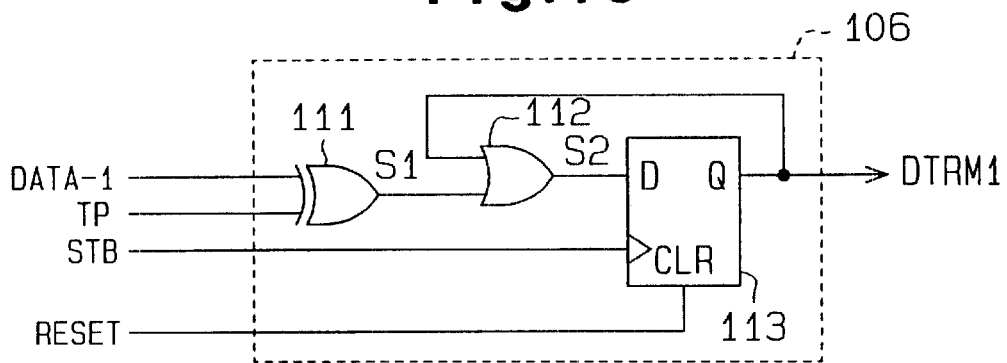

TEST CIRCUIT FOR SEMICONDUCTOR DEVICE WITH MULTIPLE MEMORY CIRCUITS

BACKGROUND OF THE INVENTION

The present invention relates to a semiconductor device and, more particularly, to a semiconductor device having a plurality of memory circuits and a memory test circuit mounted on the same chip, and to a recording medium on which data for preparing such a semiconductor device is recorded.

Semiconductor devices (LSIs) developed in recent years, such as ASICs, tend to have both logic circuits and a plurality of memory circuits mounted on a single chip.

Such a semiconductor device can achieve a higher data transfer rate (data transfer amount per unit time) between the logic circuits and the memory circuits, compared with that of a conventional semiconductor device. Further, such a semiconductor device requires no input/output circuits between the logic circuits and the memory circuits, and thus can achieve a reduction in the total power consumption, compared with a semiconductor device mounted with logic circuits and connected to a semiconductor device mounted with memory circuits.

A semiconductor device is subjected to an operation test prior to shipment to determine if the logic circuits and the memory circuits operate normally. That is, a semiconductor device is connected to a testing apparatus, and is operated in accordance with test signals supplied from the testing apparatus. The testing apparatus determines whether the semiconductor device is normal or not using the output signals of the semiconductor device.

As is well known, the memory circuits are subject, due to their structure, to memory cell defects and malfunctions caused, for example, by interference between memory cells. Therefore, it is required that the operation of the memory circuits alone be tested before that of the logic circuits. However, since the input/output terminals of the memory circuits are connected to the logic circuits, it is difficult to perform input/output operations with the memory circuits from outside the semiconductor device, because to do so requires pads for performing input/output operations with the memory circuits, and hence leads to an increase in the chip area of the semiconductor device.

To solve this problem, it has been considered to mount memory test circuits on a semiconductor device. However, as semiconductor devices become more and more multi-functional, the number of memory circuits mounted on a semiconductor device has increased, and if memory test circuits are mounted so as to correspond to the memory circuits on a one-to-one basis, the area occupied by the test circuits increases dramatically, thereby increasing the chip area and the cost of the semiconductor device. Thus, a test technique in which a plurality of memory circuits are tested using a smaller number of test circuits than the number of memory circuits is advantageous.

FIG. 1 is a schematic block diagram of a first conventional semiconductor device 1. The semiconductor device 1 includes a memory circuit 2 and a test circuit 3, which are formed on one chip together with logic circuits (not shown).

The memory circuit 2 has an input/output interface whose construction is analogous to that of an SDRAM (Synchronous Dynamic Random Access Memory). The test circuit 3 generates a control signal CMD, an address signal ADD, an operating clock signal CLK, and a data signal DATA, and outputs these signals to the memory circuit 2.

The memory circuit 2 receives the control signal CMD in synchronism with the clock signal CLK, and operates in a mode based on this control signal CMD. In the write mode, the memory circuit 2 receives an address signal ADD and a data signal DATA in synchronism with the clock signal CLK, and stores the data signal DATA in a cell whose address corresponds to the address signal ADD as cell information. In the read mode, the memory circuit 2 receives an address signal ADD in synchronism with the clock signal CLK, reads cell information stored in the cell whose address corresponds to the address signal ADD, and outputs the read information as a data signal DATA.

The test circuit 3 generates an expected value, compares the expected value with the value of the data signal DATA provided from the memory circuit 2, and outputs a determination signal DTRM generated based on the comparison result to a testing apparatus (not shown).

FIG. 2 is a schematic block diagram of a second conventional semiconductor device 4. The semiconductor device 4 includes a plurality (two in this example) of memory circuits 5a and 5b, and two test circuits 6a and 6b corresponding to the memory circuits 5a, 5b, respectively. The circuits 5a, 5b, 6a and 6b are formed on one chip together with logic circuits (not shown).

The test circuits 6a and 6b operate like the aforesaid test circuit 3. That is, the test circuit 6a applies to the memory circuit 5a a control signal CMD-1, an address signal ADD-1, a clock signal CLK-1, and a data signal DATA-1. The test circuit 6a compares the value of the data signal DATA-1 received from the memory circuit 5a with an expected value, and outputs a determination signal DTRM-1 based on the comparison result to a testing apparatus (not shown).

Further, the test circuit 6b applies to the memory circuit 5b a control signal CMD-2, an address signal ADD-2, a clock signal CLK-2, and a data signal DATA-2. The test circuit 6b compares the value of the data signal DATA-2 received from the memory circuit 5b with an expected value, and outputs a determination signal DTRM-2 based on the comparison result to the testing apparatus (not shown).

When the test circuits are mounted on the semiconductor device so as to correspond to the memory circuits on a one-to-one basis as described above, the chip area of the semiconductor device is dramatically increased. To overcome this problem, a method by which the operation of a plurality of memory circuits are tested using a single test circuit would be desirable. A third conventional semiconductor 7 device based on such a method is shown in FIG. 3.

The semiconductor device 7 includes a plurality (two in this example) of memory circuits 8a and 8b, and a test circuit 9. The circuits 8a, 8b and 9 are formed on one chip together with logic circuits (not shown).

The test circuit 9 tests the operation of the memory circuits 8a and 8b simultaneously. The reason is that when the memory circuits 8a and 8b are tested separately, it takes a lot of time, which leads to an increase in the cost of the semiconductor device 7.

The test circuit 9 applies to the memory circuit 8a a control signal CMD, an address signal ADD, and a clock signal CLK, each of which is generated to be used by the memory circuits 8a and 8b in common. Further, the test circuit 9 applies data signals DATA-1 and DATA-2, which are generated to be used individually, to the memory circuits 8a and 8b, respectively. This is because each of the memory circuits 8a and 8b uses a single terminal for both inputting and outputting data signals. If memory circuits, each having separate input and output terminals for transferring data signals, are used, a single data signal may be generated so that the memory circuits 8a and 8b can share such signal.

The test circuit 9 outputs to the testing apparatus (not shown) a determination signal DTRM having the result of a comparison made between the value of the data signal DATA-1 received from the memory circuit 8a and an expected value and the result of a comparison made between the value of the data signal DATA-2 received from the memory circuit 8b and the expected value. Thus, by using a single test circuit 9 to simultaneously test the two memory circuits 8a and 8b, the semiconductor device 7 prevents its chip area and testing time from increasing.

However, the third conventional the semiconductor device 7 encounters a problem concerning the distance between the test circuit 9 and each of the memory circuits 8a and 8b. That is, the wire length of a signal line between the test circuit 9 and the memory circuit 8b is longer than that between the test circuit 9 and the memory circuit 8a. There is a delay corresponding to the wire length to a signal output from the test circuit 9, and thus a lag between the times at which the memory circuits 8a and 8b receive such a signal.

FIG. 4(a) is a waveform chart of the input/output terminals of the test circuit 9; FIG. 4(b) is a waveform chart of the input/output terminals of the memory circuit 8a; and FIG. 4(c) is a waveform chart of the input/output terminals of the memory circuit 8b.

Now, the test circuit 9 outputs a control signal CMD for a command "ACT" in synchronism with the clock signal CLK at time t1. The memory circuit 8a receives the command at time t2, which is Δt1 past time t1, and the memory circuit 8b receives the same command at t3, which is Δt2 past time t1.

The memory circuits 8a and 8b operate in response to the command. The signals output by the memory circuits 8a and 8b reach the test circuit 9 while subjected to delays equal to the wire lengths similar to the signal which they receive. Therefore, the test circuit 9 receives data signals DATA-1 and DATA-2 from the memory circuits 8a and 8b at different time, respectively.

That is, the test circuit 9 receives the data signal DATA-1 from by the memory circuit 8a at time t4, and receives the data signal DATA-2 from the memory circuit 8b at time t5, which is later than time t4. Thus, the test circuit 9 cannot determine the operation of the memory circuit 8a and the operation of the memory circuit 8b at the same time. This requires that the test circuit 9 perform complicated determination operations, and which hinders the implementation of operation tests with a single test circuit.

SUMMARY OF THE INVENTION

An object of the present invention is to provide a semiconductor device which prevents the area occupied by a test circuit from increasing and performs simultaneous testing of a plurality of memory circuits.

In a first aspect of the present invention, a semiconductor device including a plurality of memory circuits and a test circuit for testing the plurality of memory circuits is provided. Test circuit includes a test section for controlling the plurality of memory circuits to perform a read operation and generating expected value data corresponding to read data from the plurality of memory circuits. A plurality of comparison/determination circuits are connected to the test section and the plurality of memory circuits, compare the read data and the expected value data, and generate determination signals.

In a second aspect of the present invention, a semiconductor device including a plurality of memory circuits, a test circuit for testing the plurality of memory circuits, and a plurality of signal correction circuits. The test circuit provides a control signal to the plurality of memory circuits to initiate a read operation, receives read data signals from the plurality of memory circuits and compares the read data signals with expected value data signals corresponding to the read data signals The plurality of signal correction circuits delays at least one of the control signal and the read data signals such that the read data signals reach the test circuit substantially simultaneously.

In a third aspect of the present invention, a recording medium on which hardware description language (HDL) data describing the behavior of a test circuit for testing a plurality of memory circuits is recorded is provided. The test circuit includes a test section and a comparison/determination circuit. The HDL data includes first and second data segments. The first data segment describes the behavior of the test section for controlling the plurality of memory circuits to perform a read operation, and generating expected value data corresponding to read data from the plurality of memory circuits. The second data segment describes the behavior of the comparison/determination circuits for comparing the read data and the expected value data and generating determination signals.

In a fourth aspect of the present invention, a recording medium on which hardware description language (HDL) data describing the behavior of a test circuit for testing a plurality of memory circuits is recorded is provided. The HDL data includes first and second data segments. The first data segment describes the behavior of the test circuit for providing a control signal to the plurality of memory circuits to perform a read operation, receiving read data signals from the plurality of memory circuits and comparing the read data signals with expected value data signals corresponding to the read data signals. The second data segment describes the behavior of a plurality of signal correction circuits for delaying at least one of the control signal and the read data signals such that the read data signals reach the test circuit substantially simultaneously.

In a fifth aspect of the present invention, a recording medium on which cell data about a test circuit for testing a plurality of memory circuits is recorded is provided. The cell data includes first and second cell data segments. The first cell data segment of a test section controls the plurality of memory circuits to perform a read operation and generates expected value data corresponding to read data from the plurality of memory circuits. The second cell data segment of a comparison/determination circuits for compares the read data and the expected value data and generates determination signals.

In sixth aspect of the present invention, a recording medium on which cell data about a test circuit for testing a plurality of memory circuits is recorded is provided. The data includes first and second cell data segments. The first cell data segment of the test circuit provides a control signal to the plurality of memory circuits to perform a read operation, receives read data signals from the plurality of memory circuits and compares the read data signals with expected value data signals corresponding to the read data signals. The second cell data segment of a plurality of signal correction circuits for delays at least one of the control signal and the read data signals such that the read data signals reach the test circuit substantially simultaneously.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 7 is a diagram illustrating the functions of a test section of the semiconductor device of FIG. 5;

FIG. 9 is a schematic diagram of a semiconductor design apparatus;

FIG. 10(a) to 10(c) illustrate data descriptions of a testing circuit, a comparison/determination circuit and a memory circuit in schematic form;

FIG. 17 is a schematic block diagram of a semiconductor device according to a third embodiment of the present invention;

FIG. 18 is a schematic diagram of a comparison/determination circuit of the semiconductor device of FIG. 17;

DETAILED DESCRIPTION OF THE PREFERRED EMBODIMENTS

Figure 1:
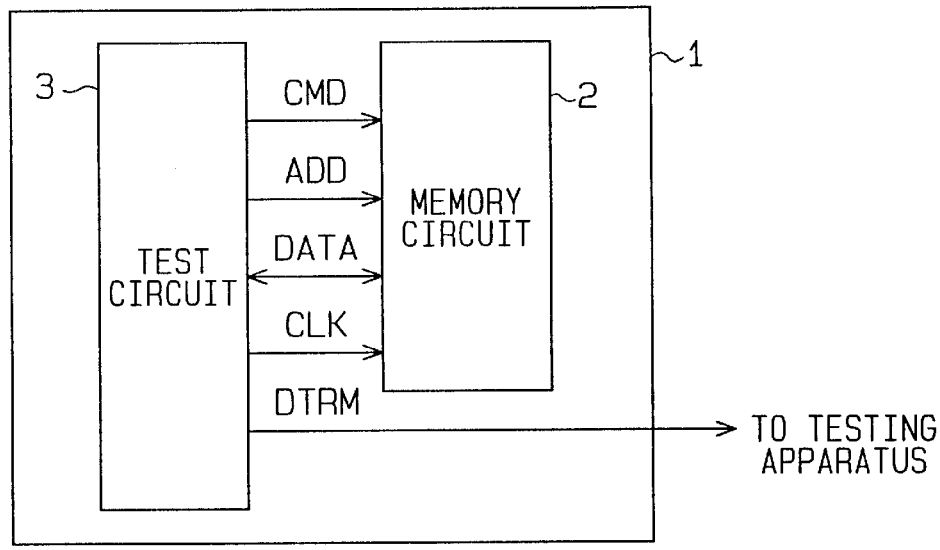
FIG. 1 is a schematic block diagram of a first conventional semiconductor device.
Figure 2:
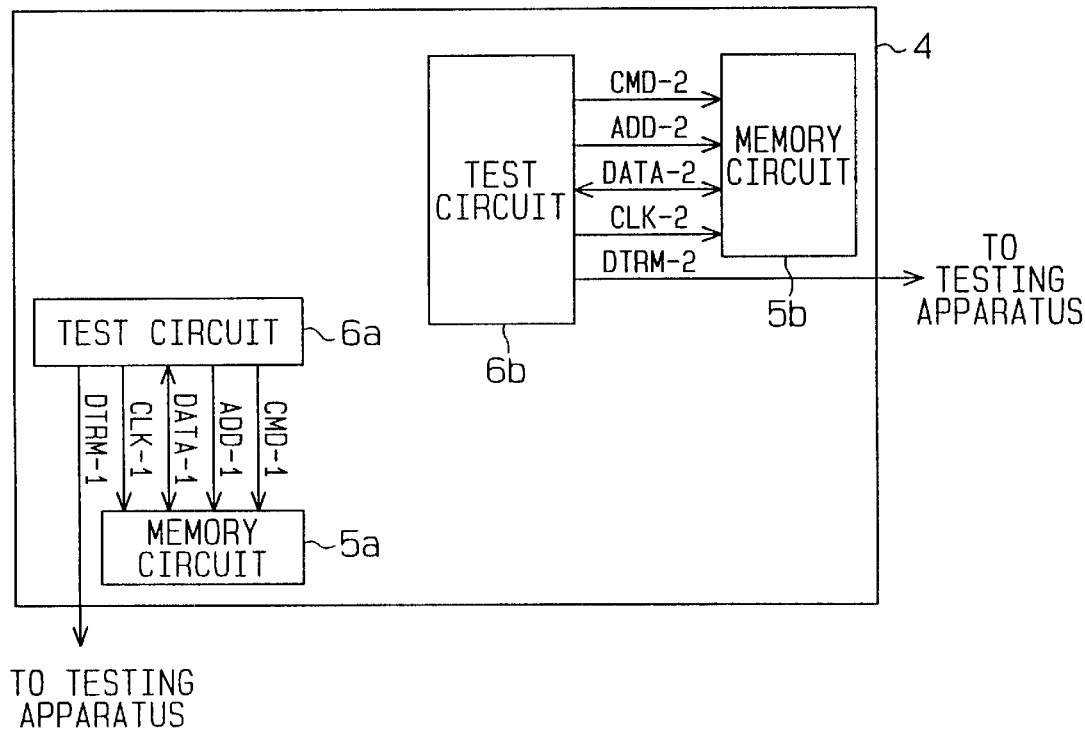
FIG. 2 is a schematic block diagram of a second conventional semiconductor device.
Figure 3:
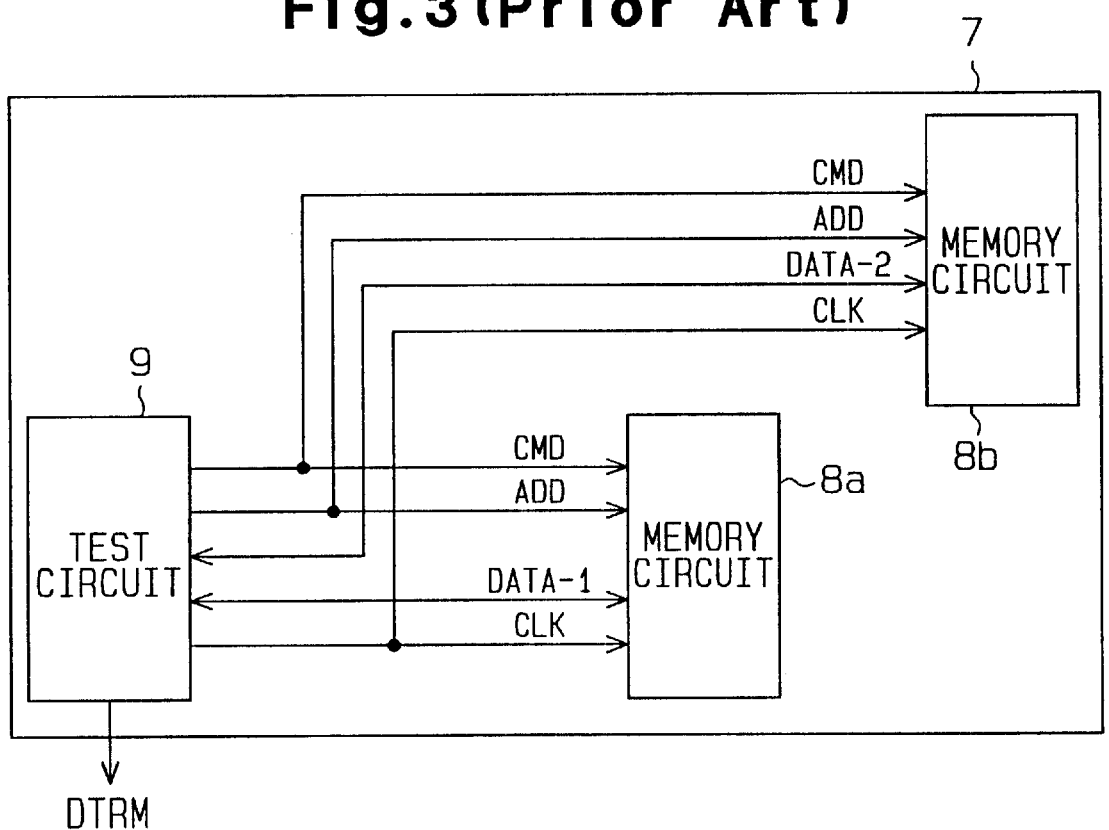
FIG. 3 is a schematic block diagram of a third conventional semiconductor device.
Figure 4A:
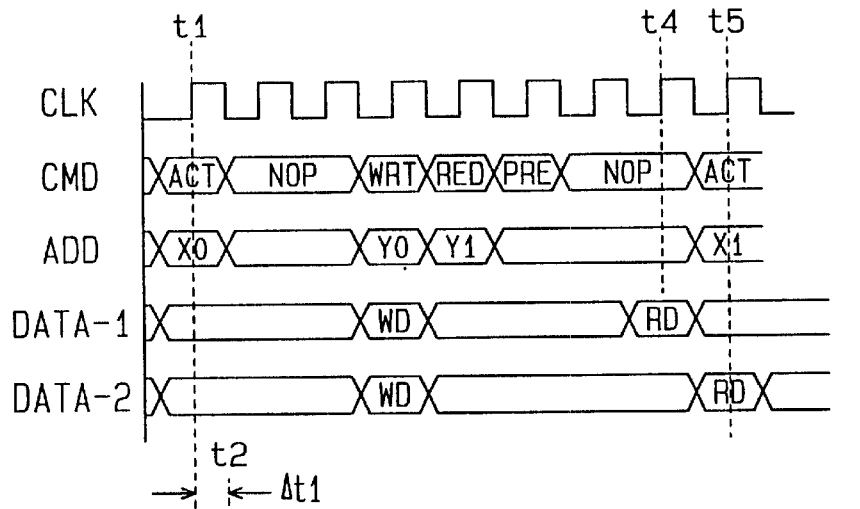
FIGS. 4(a) to 4(c) are timing charts of the third conventional semiconductor device of FIG. 3.
Figure 4B:
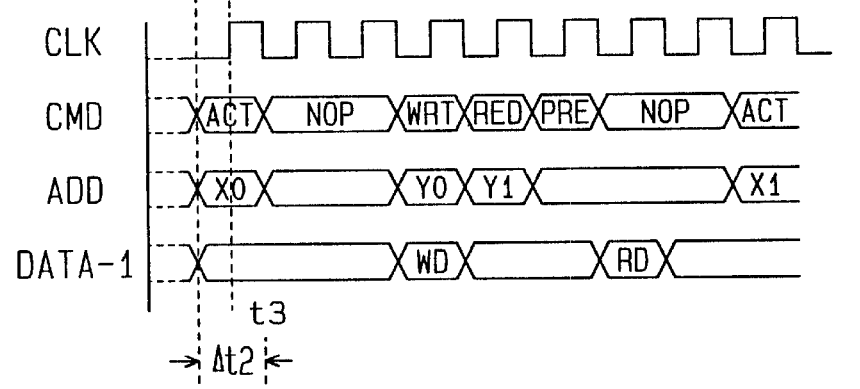
Figure 4C:
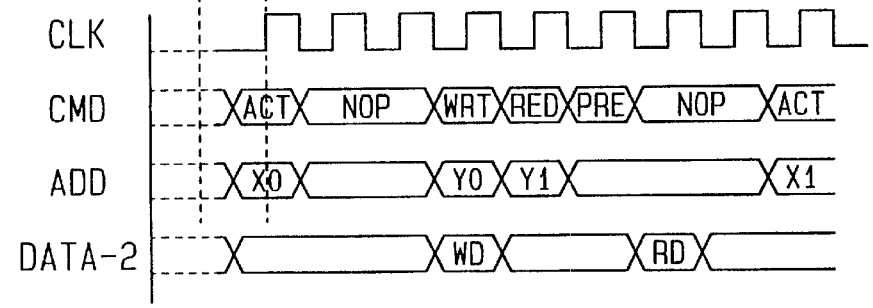

In the drawings, like numerals are used for like elements throughout.

First Embodiment

A semiconductor device 11 according to a first embodiment of the present invention will now be described in accordance with FIGS. 5 to 10.

Figure 6:
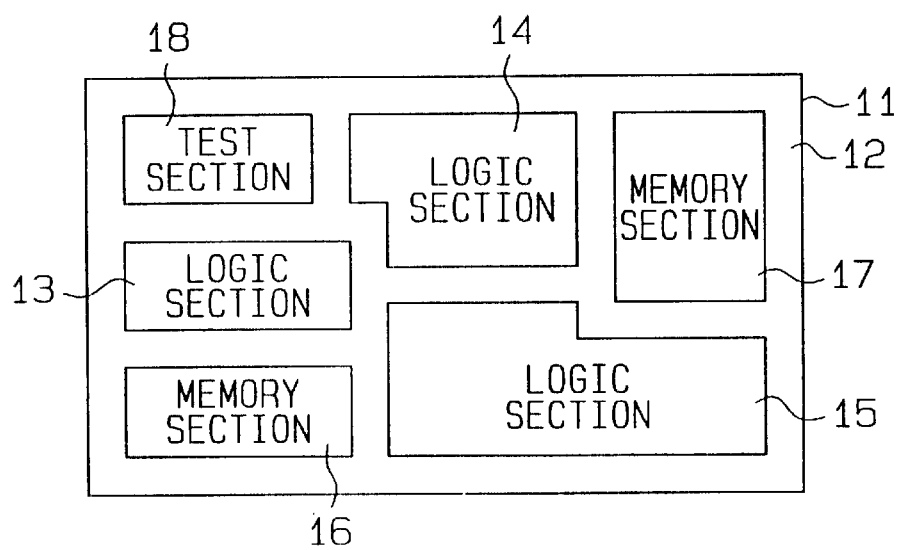
FIG. 6 is a schematic plan view of the semiconductor device of FIG. 5.

FIG. 6 is a schematic plan view of the semiconductor device 11. On a chip 12 of the semiconductor device 11 are logic sections 13, 14 and 15, memory sections 16 and 17, and a test section 18.

Figure 5:
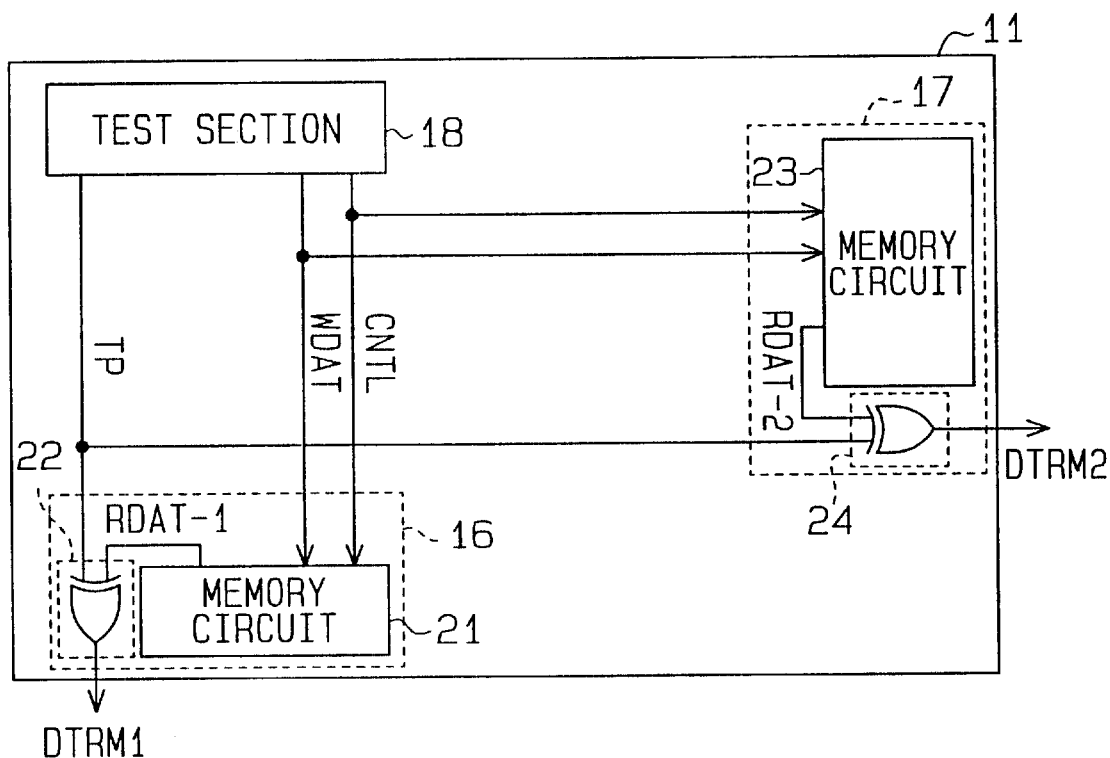
FIG. 5 is a schematic block diagram of a semiconductor device according to a first embodiment of the present invention.

FIG. 5 is a block diagram of the semiconductor device 11. The test section 18 receives a test mode signal from a testing apparatus (not shown), and outputs to the memory sections 16 and 17 a control signal CNTL, write data WDAT, and expected value data TP that have been generated in response to the test mode signal.

The control signal CNTL includes a clock signal CLK, a command control signal CMD, and an address signal ADD that are shown in FIG. 7. That is, the test section 18 has a first circuit 18a for generating a control signal CNTL (CLK, CMD, ADD), a second circuit 18b for generating write data WDAT, and a third circuit 18c for generating expected value data TP. Note that the value of the write data WDAT can be made equal to that of the expected value data TP, and thus the test section 18 may also be constructed to have at least the first and third circuits 18a and 18c.

As shown in FIG. 5, the first memory section 16 includes a memory circuit 21 and a comparison/determination circuit 22. The test section 18 and the comparison/determination circuit 22 serve as a test circuit. The memory circuit 21 has an input/output interface whose construction is analogous to an SDRAM (Synchronous Dynamic Random Access Memory), receives a control signal CNTL and write data WDAT, and stores the write data WDAT as cell information. Further, the memory circuit 21 outputs to the comparison/determination circuit 22 read data RDAT-1 having the cell information read in response to a control signal CNTL.

The comparison/determination circuit 22 receives the expected value data TP, compares it with the read data RDAT-1, and outputs a determination signal DTRM1 having a level based on the comparison result. The comparison/determination circuit 22 preferably includes an XOR circuit. The circuit 22 outputs an L-level determination signal DTRM1 when the expected value data TP matches with the read data RDAT-1, and outputs an H-level determination signal DTRM1 when they do not match.

Similar to the memory section 16, the second memory section 17 includes a memory circuit 23 and a comparison/determination circuit 24 as the test circuit. The memory circuit 23 has substantially the same construction as that of the memory circuit 21. The circuit 23 stores the write data WDAT as cell information in response to the control signal CNTL, and outputs to the comparison/determination circuit 24 read data RDAT-2 having the cell information read in response to the control signal CNTL. The comparison/determination circuit 24 has substantially the same construction as that of the comparison/determination circuit 22. The circuit 24 receives the expected value data TP, compares it with the read data RDAT-2, and outputs a determination signal DTRM2 based on the comparison result.

Next, the operation of the semiconductor device will be described in accordance with FIGS. 8(a)–8(c).

Figure 8A:
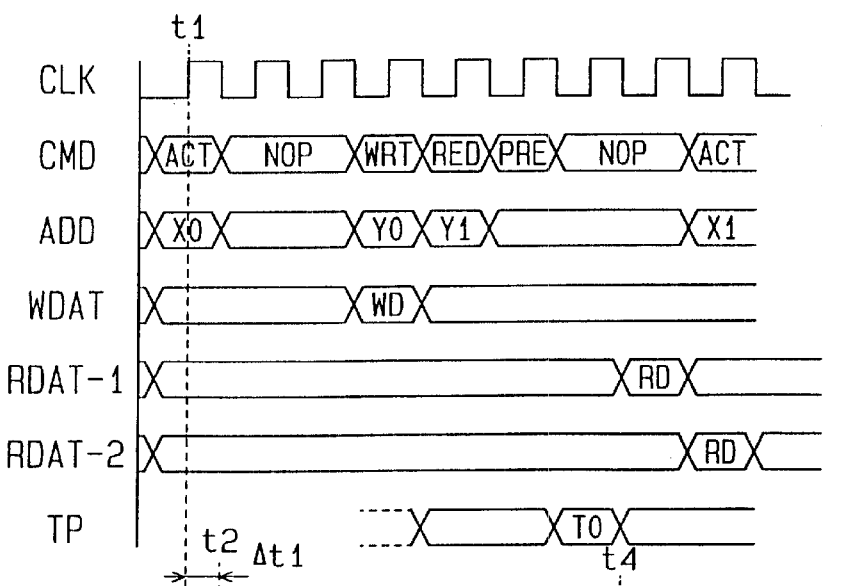
FIGS. 8(a) to 8(c) are timing charts of the semiconductor device of FIG. 5.
Figure 8B:
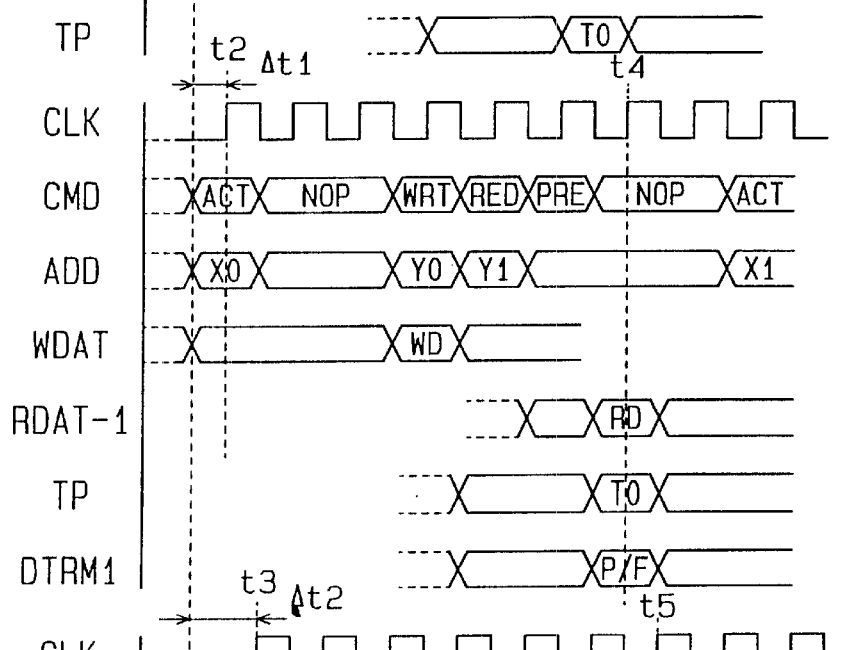
Figure 8C:
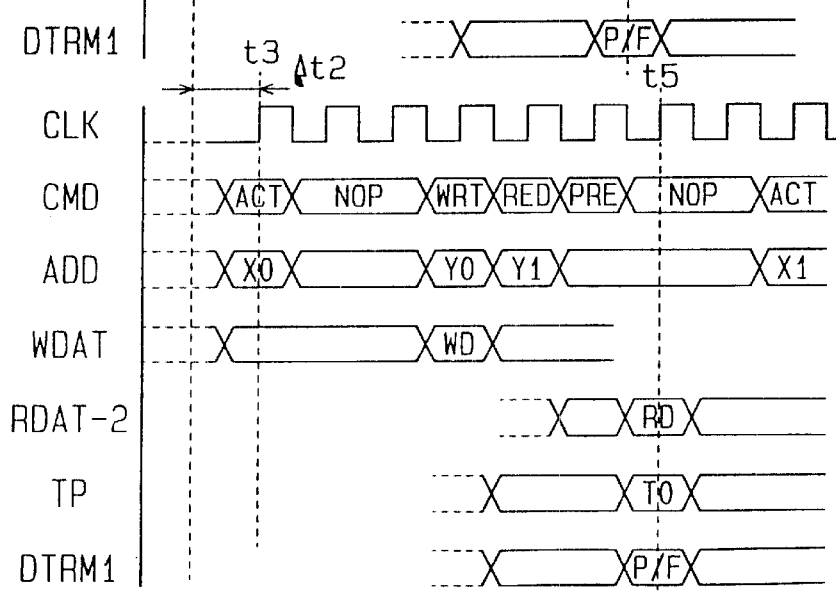

FIG. 8(a) is a waveform chart at the input/output terminals of the test section 18; FIG. 8(b) is a waveform chart at the input/output terminals of the first memory section 16; and FIG. 8(c) is a waveform chart at the input/output terminals of the second memory section 17.

Now, the test section 18 provides a control signal CMD for a command "ACT" in synchronism with a clock signal CLK at time t1. The first memory section 16 receives the signal CMD at time t2, which is $\Delta t1$ past time t1, and the second memory section 17 receives the same signal at time t3, which is $\Delta t2$ past time t1. The first and second memory sections 16 and 17 operate in response to the received command.

Next, the test section 18 provides to both memory sections 16 and 17 a control signal CMD corresponding to a read command "RED" in synchronism with a clock signal CLK. Then, the test section 18 provides expected value data TP having a value "T0" to both memory sections 16 and 17 after a time period (two clock cycles in FIG. 8) corresponding to the operations of the memory circuits 21 and 23 has elapsed.

Each of the expected value data signals TP provided from the test section 18 has a delay ($\Delta t1$ or $\Delta t2$) corresponding to each of the wire lengths, and reaches each of the first and second memory sections 16 and 17. The memory circuit 21 of the first memory section 16 provides, in synchronism with the clock signal CLK, read data RDAT-1 based on the cell information read in response to the command "RED". The memory circuit 23 of the second memory section 17 provides, in synchronism with the clock signal CLK, read data RDAT-2 based on the cell information read in response to the command "RED".

The comparison/determination circuit 22 receives the read data RDAT-1 and the expected value data TP. The expected value data TP is subjected to the same delay ($\Delta t1$) as that of the control signal CMD. Therefore, the time at which the comparison/determination circuit 22 receives the read data RDAT-1 substantially coincides with the time at which the circuit 22 receives the expected value data TP.

Similarly, the comparison/determination circuit 24 receives the read data RDAT-2 and the expected value data TP. The expected value data TP is subjected to the same delay ($\Delta t2$) as that of the control signal CMD. Therefore, the time at which the comparison/determination circuit 24 receives the read data RDAT-2 substantially coincides with the time at which the circuit 24 receives the expected value data TP.

That is, the comparison/determination circuit 22 of the first memory section 16 determines whether the first memory circuit 21 operates normally at time t4, and the comparison/determination circuit 24 of the second memory section 17 determines whether the second memory circuit 23 operates normally at time t5. Thus, the test section 18 tests the operation of the first memory section 16 and the operation of the second memory section 17 at substantially the same time.

Next, the designing of the semiconductor device 11 will be described. FIG. 9 is a schematic block diagram of the hardware configuration of a semiconductor design apparatus 30.

The semiconductor design apparatus 30 includes a central processing unit (CPU) 31. The CPU 31 is connected to an input unit 32, an output unit 33, a memory 34, storage units 35, 36, 37 and 38, and a drive unit 39.

The input unit 32 includes a keyboard and a mouse, and is used to allow a user to make requests and enter or execute instructions, for example, for activating programs and inputting parameters. The output unit 33 includes a display unit (VDT), and a printer, and is used to display and print graphics, lists, and parameter input screens.

The memory 34 stores programs and data necessary for performing semiconductor design processes. The CPU 31 executes the programs using the memory 34 to perform the processes. The memory 34 preferably includes a cache memory, a system memory and a display memory.

The first to third storage units 35 to 37 preferably include a magnetic disk unit, an optical disk unit, and a magnetic optical disk unit. These types of disks are used appropriately in accordance with the type, state, etc. of the data to be stored in the respective storage units 35 to 37. Note that FIG. 9 shows the storage units 35 to 37 as they are functionally divided. However, these storage units may also be integrated into one storage unit without being divided.

The first storage unit 35 stores data described in a predetermined design level or hardware description language (HDL) in order to prepare the semiconductor device 11 of FIG. 5. Note that the first storage unit 35 stores data described in a behavior level hardware description language.

More specifically, as shown in FIGS. 10(a)–10(c), the input data includes areas 41, 42 and 43 in which the behavior descriptions of the memory sections 16 and 17, and the test section 18 of FIG. 5 are stored, respectively. The area 41 of FIG. 10(a) includes data describing the behavior of the test section 18. The area 41 includes areas 41a, 41b and 41c in which the behavior description of the function circuits 18a, 18b and 18c (FIG. 7) of the test section 18 are stored. The area 42 of FIG. 10(b) includes data describing the behavior of the comparison/determination circuit. The area 43 of FIG. 10(c) includes data describing the behavior of the memory circuit. The area 43 includes areas 43a, 43b and 43c. The area 43a includes data describing the behavior of a first input section for receiving an addressing signal (which is a control signal CNTL of FIG. 5, including the clock signal CLK, the control signal CMD, and the address signal ADD that are shown in FIG. 8). The area 43b includes data describing the behavior of a second input section for receiving write data WDAT. The area 43c includes data of the behavior of an output section for outputting read data RDAT.

The second storage unit 36 stores a design rule library for preparing the semiconductor device 11. The design rules have values corresponding to predetermined design levels.

The third storage unit 37 stores program data to be executed by the CPU 31. The program data is a program for generating, from the input data of the first storage unit 35, data whose level is lower than the level of the input data, as is understood by those of skilled in the art.

The CPU 31 is activated based on the operation of the input unit 32, and stores the output data generated by performing generation processes using the input data and the library in the fourth storage unit 38.

More specifically, the CPU 31 generates the graphic data of the memory circuits 21 and 23 shown in FIG. 5 from the behavior description data of the memory circuit 43 using the input data and the library 36. Further, the CPU 31 generates the graphic data of the test section 18 shown in FIG. 5 from the behavior description data of the test section 18 included in the input data. The behavior description data of the test section 18 includes information about the memory circuits 16, 17 to be tested by the test section 18 (e.g., the number of circuits). Therefore, the CPU 31 generates data for as many comparison/determination circuits as there are memory circuits to be tested from the behavior description of the comparison/determination circuit 42 included in the input data.

Still further, the CPU 31 generates the graphic data of the comparison/determination circuits 22 and 24 shown in FIG. 5, and data for the wirings through which the output data (read data RDAT-1, read data RDAT-2) of the memory circuits 21 and 23 are provided to the comparison/determination circuits 22 and 24. Then, the CPU 31 stores the output data including such generated data in the fourth storage unit 38 of FIG. 9.

The graphic data includes electrical information including the type, size and the like of elements which form the circuits, element arrangement information, inter-element connection information, or combinations of such information, and includes layout data, exposure data and the like.

Note that although the graphic data is generated as the lower-level data in what has been described above, RTL (Register Transfer Level) information, net lists, and circuit diagrams may be generated as the lower-level data. Further, data describing for example, RTL and logic-level behavior may also be used as the input data.

All or part of the input data in the first storage unit 35, the library data in the second storage unit 36, and the program data in the third storage unit 37 may be supplied by a recording medium 40. The CPU 31 drives the drive unit 39 to load the data recorded on the recording medium 40 to the respective storage units 35, 36 and 37. Note that the program data recorded on the recording medium 40 may be directly executed, or the data recorded in the recording medium 40 may be directly referenced. Further, the output data of the fourth storage unit 38 is supplied to a semiconductor manufacturing apparatus using the recording medium 40. The CPU 31 saves the output data in the fourth storage unit 38.

The recording medium 40 is a computer readable recording medium, including any of desired media such as Magnetic Tapes(MTs), memory cards, flexible disks, optical disks (CD-ROMs, DVD-ROMs, etc.), and magneto optical disks (MOs, MDs, etc.). Further, the medium 40 also includes not only a recording medium in which programs that can be directly executed by a computer are recorded, but also a recording medium on which programs that can be executed once installed on another recording medium (a hard disk or the like) are recorded, and a recording medium in which coded or compressed programs are recorded. Still further, the medium 40 includes a recording medium in which program data is loaded via a communication medium, and the storage units 35 to 37.

As described above, the first embodiment provides the following advantages.

(1) The test section 18 provides a control signal CNTL to the two memory circuits 21 and 23, and the memory circuits 21 and 23, in response to the received signal CNTL, provide read data RDAT-1 and read data RDAT-2 to the comparison/determination circuits 22 and 24. The comparison/determination circuits 22 and 24 compare expected value data TP supplied from the test section 18 with the read data RDAT-1 and the read data RDAT-2, and output determination signals DTRM1 and DTRM2. The expected value data TP received by the comparison/determination circuits 22 and 24 is subjected to the same delays as those to which the control signal CNTL received by the memory circuits 21 and 22 is subjected. Therefore, the time at which the comparison/determination circuits 22 and 24 receive the expected value data TP substantially coincides with the time at which the circuits 22 and 24 receive the read data RDAT-1 and the read data RDAT-2. Since the test section 18 tests the operations of the two memory circuits 21 and 23 at the same time, the testing time is decreased.

(2) Since the two memory circuits 21 and 23 are tested using only one test section 18, the chip area is not increased.

(3) By preparing the test section 18 and the comparison/determination circuits 22 and 24 to be mounted on a semiconductor device in accordance with the description of the data recorded in the recording medium 40, there is provided a semiconductor device in which not only the chip area is prevented from increasing but also a plurality of memory circuits are tested simultaneously for their operation.

Note that this embodiment may be modified in the following forms.

(A) The cell information about the test section 18 and the comparison/determination circuits 22 and 24 may be registered at a cell library. As a result, the semiconductor device 11 is easily prepared by the semiconductor design apparatus 30 using the cell information.

(B) In the aforesaid embodiment, each of the comparison/determination circuits 22 and 24 includes an XOR circuit. This corresponds to the output configuration of each of the memory circuits 21 and 23. That is, to accommodate one-bit read data RDAT-1 and one-bit read data RDAT-2. Therefore, the construction of the comparison/determination circuits 22, 24 are appropriately modified to correspond to the construction of the memory circuits 21 and 23 (the number of bits of the read data), the number of bits of the expected value data, and the method of comparing the read data with the expected value data.

Figure 11:
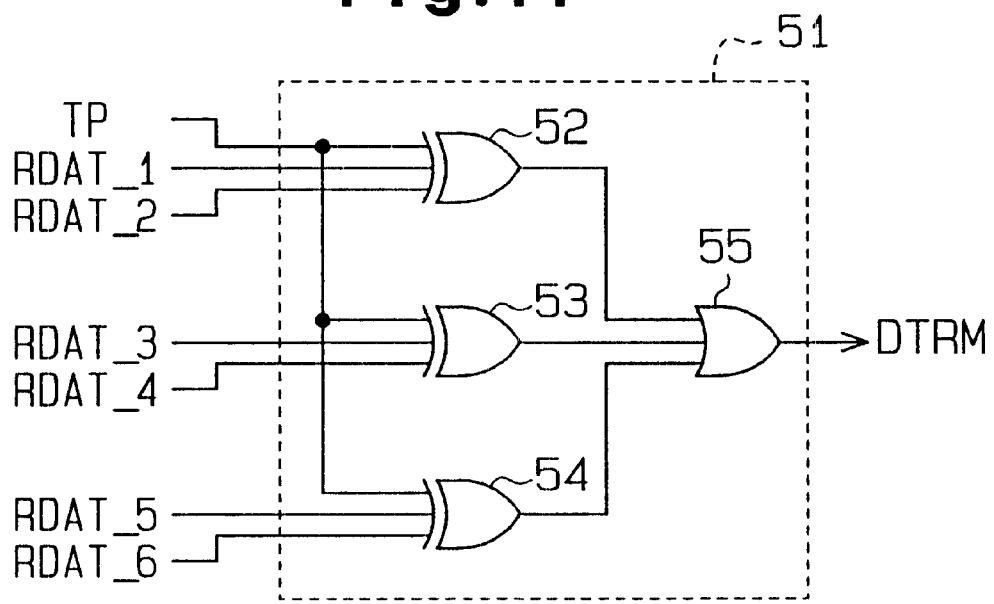
FIG. 11 is a schematic diagram of a first comparison/determination circuit.

The following is one example of modification. A comparison/determination circuit 51 of FIG. 11 compares a piece of multi-bit read data RDAT#1 to RDAT#6 with one-bit expected value data TP. More specifically, the comparison/determination circuit 51 compares the expected value data TP with every bit of the read data (every two bits in FIG. 11), and outputs a one-bit determination signal DTRM generated by combining a plurality of intermediate comparison results.

The comparison/determination circuit 51 has three, three-input XOR circuits 52, 53 and 54, and one three-input OR circuit 55. The two bits of the read data RDAT#1 and RDAT#2 and the expected value data TP are provided to the first XOR circuit 52, and the circuit 52 outputs an L-level signal when the levels of these three inputs coincide, and an H-level signal when their levels do not coincide. Similarly, the two bits of the read data RDAT#3 and RDAT#4 and the expected value data TP are provided to the second XOR circuit 53, and the two bits of the read data RDAT#5 and RDAT#6 and the expected value data TP are provided to the third XOR circuit 54.

The OR circuit 55 outputs a determination signal DTRM generated by ORing the output signals of the XOR circuits 52, 53 and 54. Therefore, the comparison/determination circuit 51 outputs an L-level determination signal DTRM when the expected value data TP coincides with the read data RDAT#1 to RDAT#6.

Figure 12:
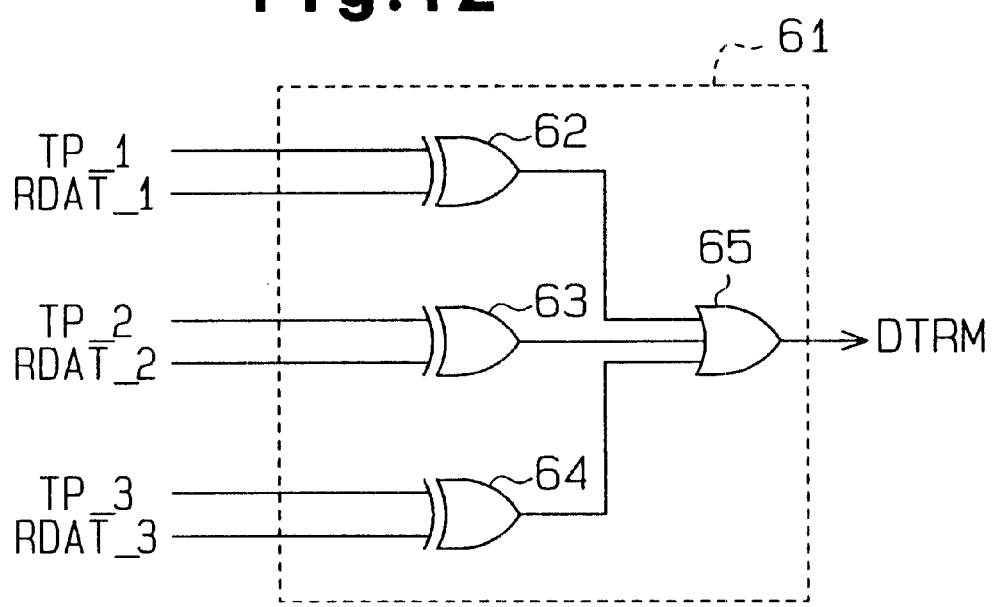
FIG. 12 is a schematic diagram of a second comparison/determination circuit.

The following is another example. A comparison/determination circuit 61 of FIG. 12 compares, bit by bit, multi-bit read data RDAT#1 to RDAT#3 with expected value data TP#1 to TP#3 that has the same number of bits as the read data, and to output a one-bit determination signal DTRM generated by combining a plurality of intermediate comparison results. That is, the comparison/determination circuit 61 is provided adjacent to a memory circuit that outputs three-bit read data RDAT#1 to RDAT#3, and a test section corresponding to such a memory circuit outputs three-bit expected value data TP#1 to TP#3.

The comparison/determination circuit 61 has three, two-input XOR circuits 62, 63 and 64, and one three-input OR circuit 65. The data bit RDAT#1 and the expected value data bit TP#1 corresponding to the data bit RDAT#1 are provided to the first XOR circuit 62, and the circuit 62 outputs an L-level signal when both levels coincide, and an H-level signal when both levels do not coincide. Similarly, the read data bit RDAT#2 and the expected value data bit TP#2 corresponding thereto are provided to the second XOR circuit 63, and the read data bit RDAT#3 and the expected value data bit TP#3 corresponding thereto are provided to the third XOR circuit 64.

The OR circuit 65 outputs a determination signal DTRM generated by ORing the output signals of the XOR circuits 62, 63 and 64. Therefore, the comparison/determination circuit 61 outputs an L-level determination signal DTRM when the level of a piece of three-bit read data RDAT#1 to RDAT#3 coincides with the level of a piece of three-bit expected value data TP#1 to TP#3 corresponding thereto, respectively.

Figure 13:
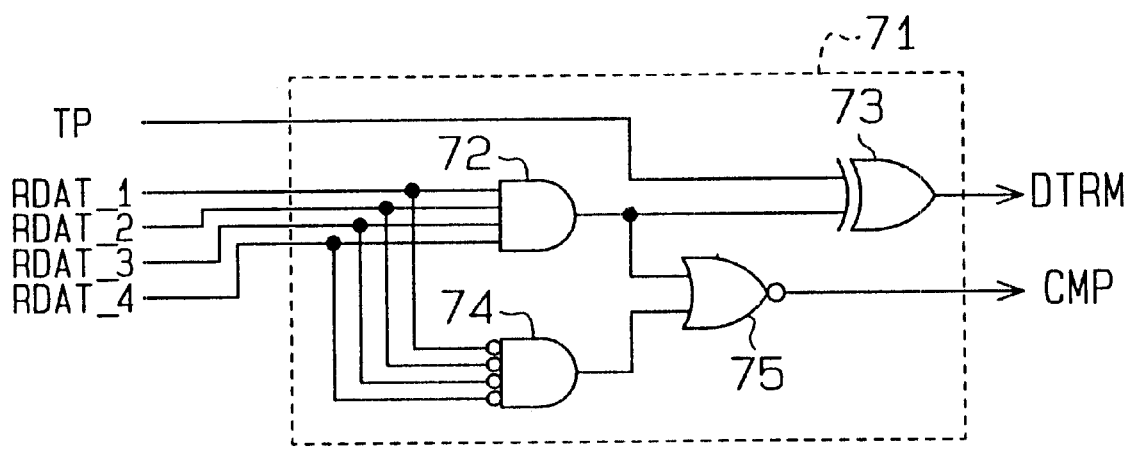
FIG. 13 is a schematic diagram of a third comparison/determination circuit.

The following is still another example. A comparison/determination circuit 71 of FIG. 13 compares a piece of multi-bit read data RDAT#1 to RDAT#4 with a piece of one-bit expected value data TP, and outputs a first determination signal DTRM and a second determination signal CMP. More specifically, the comparison/determination circuit 71 compresses the read data bits RDAT#1 to RDAT#4, and outputs a first determination signal DTRM generated by comparing the expected value data TP with the compressed result, and a second determination signal CMP that is based on the compressed result. A testing apparatus (not shown) receives the determination signals DTRM and CMP, and determines whether the memory circuits (i.e., the semiconductor device (chip)) passes or fails based on these signals.

The comparison/determination circuit 71 has an AND circuit 72, an XOR circuit 73, and two NOR circuits 74 and 75. The AND circuit 72 has the number of input terminals corresponding to the number of bits of read data, and outputs a signal S1 generated by compressing (ANDing) the read data bits RDAT#1 to RDAT#4. The signal S1 is output at H level when all of the read data bits RDAT#1 to RDAT#4 are at H level. Therefore, the AND circuit 72 compresses the H-level read data bits RDAT#1 to RDAT#4 into a one-bit signal S1.

The XOR circuit 73 compares the signal S1 with the expected value data TP, and outputs a first determination signal DTRM based on the comparison result. Therefore, the comparison/determination circuit 71 outputs an L-level first determination signal DTRM when the signal S1 matches with the expected value data TP, i.e., when a piece of four-bit read data RDAT#1 to RDAT#4 matches a piece of expected value data TP.

The NOR circuit 74 has the same number of input terminals as the number of bits of read data, and outputs a signal S2 generated by compressing (NORing) the read data bits RDAT#1 to RDAT#4. The signal S2 is output at an H level when all of the read data bits RDAT#1 to RDAT#4 are at an L level. Therefore, the NOR circuit 74 compresses the read data bits RDAT#1 to RDAT#4 into a one-bit signal S2. Therefore, the signal S1 and the signal S2 are complementary when the levels of all of their read data bits RDAT#1 to RDAT#4 coincide.

The NOR circuit 75 compares (NORs) the signal S1 with the signal S2, and outputs a second determination signal CMP generated based on the comparison result. Therefore, the NOR circuit 75 outputs an L-level second determination signal CMP when the level of a signal S1 does not coincide with that the signal S2, and outputs an H-level second determination signal CMP when both signals S1 and S2 are at L level.

It is understood from the above that the expected value data TP coincides with the piece of four-bit read data RDAT#1 to RDAT#4 when the first determination signal DTRM and the second determination signal CMP are at the L level.

The comparison/determination circuit 71 prevents erroneous determination when the value of expected value data TP is "0." When the value of expected value data is "0" and the values of read data bits RDAT#1 to RDAT#4 are "1," "0," "0," and "0," the AND circuit 72 outputs an L-level signal S1, and the XOR circuit 73 outputs an L-level first determination signal DTRM. This is the result obtained when the expected data TP coincides with the piece of four-bit read data RDAT#1 to RDAT#4. However, the NOR circuit 74 outputs an L-level signal S2, and the NOR circuit 75 outputs an H-level second determination signal CMP. Therefore, it is understood from the second determination signal CMP that the expected value data TP does not coincide with the four-bit read data RDAT#1 to RDAT#4.

Second Embodiment

Figure 14:
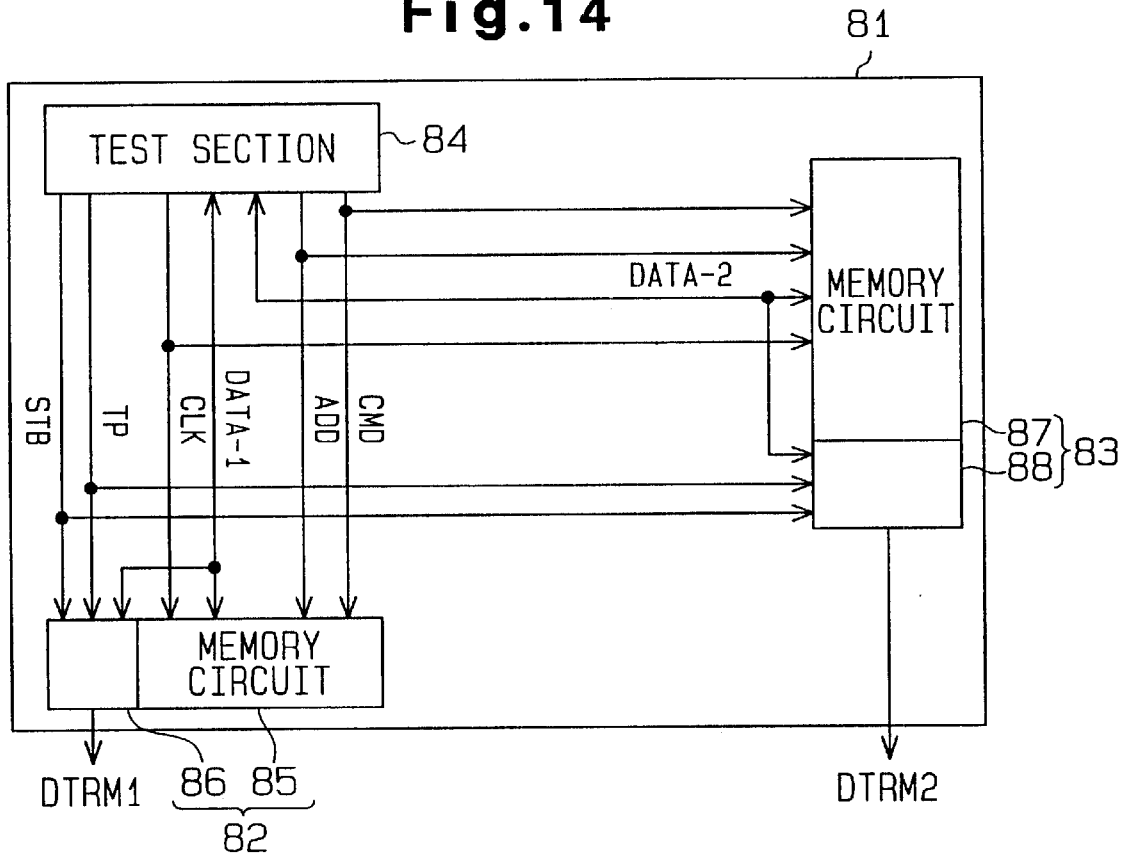
FIG. 14 is a schematic block diagram of a semiconductor device according to a second embodiment of the present invention.

A semiconductor device 81 according to a second embodiment of the present invention will be described in accordance with FIGS. 14 to 16. FIG. 14 is a partial block diagram of the semiconductor device 81. The semiconductor device 81 includes two memory sections 82 and 83, and a test section 84, and these components are formed on one chip together with logic circuits (not shown).

The memory section 82 includes a memory circuit 85 and a comparison/determination circuit 86, and the memory section 83 includes a memory circuit 87 and a comparison/determination circuit 88. Each of the memory circuits 85 and 87 has an input/output interface whose construction is analogous to that of an SDRAM, and uses a single terminal for both inputting and outputting data. Therefore, the memory sections 82 and 83 are connected to the test section 84 through separate bus lines (wirings for signals DATA-1 and DATA-2 in FIG. 14). Note that write data and read data are described while denoted by the same reference character since a single terminal is used for both inputting and outputting data in the second embodiment.

The test section 84 generates a control signal (including a command control signal CMD, an address signal ADD, and a clock signal CLK), generates write data DATA-1 and write data DATA-2, generates expected value data TP, and generates a comparison timing signal STB. The test section 84 receives a test mode signal from a testing apparatus (not shown), and provides to the memory sections 82 and 83 a control signal (including a command control signal CMD, an address signal ADD, and a clock signal CLK), expected value data TP, and a comparison timing signal STB generated in response to the test mode signal. Further, the test section 84 provides write data DATA-1 to the first memory section 82 and write data DATA-2 to the second memory section 83.

The memory circuit 85 of the first memory section 82 receives a control signal (CMD, ADD, CLK) and write data DATA-1, and stores the write data DATA-1 as cell information. Further, the memory circuit 85 provides to the comparison/determination circuit 86 read data DATA-1 having the cell information read in response to a control signal (CMD, ADD, CLK).

The comparison/determination circuit 86 receives a comparison timing signal STB and expected value data TP, compares the expected value data TP with the read data DATA-1, and latches the comparison result in accordance with the comparison timing signal STB. The latched signal level is updated in accordance with the comparison timing signal STB. The comparison/determination circuit 86 outputs a determination signal DTRM1 having a level corresponding to that of the latched signal.

Figure 15:
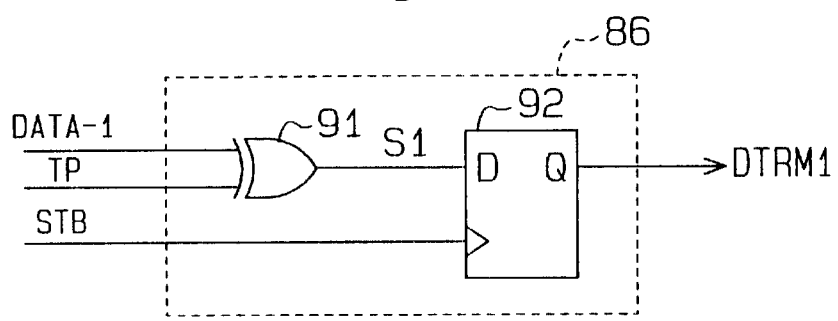
FIG. 15 is a schematic diagram of a comparison/determination circuit of the semiconductor device of FIG. 14.
Figure 16:
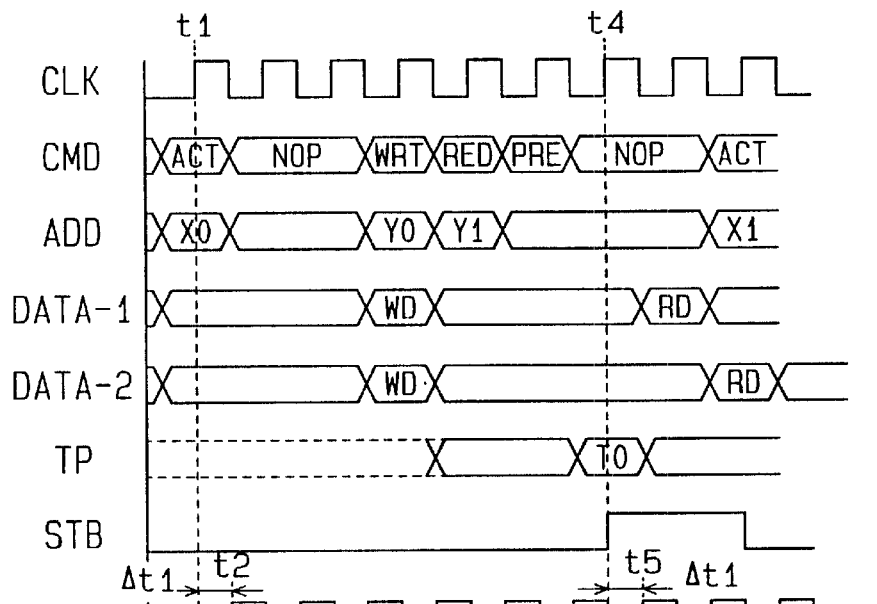
FIGS. 16(a) to 16(c) are timing charts of the semiconductor device of FIG. 14.
Figure 16:
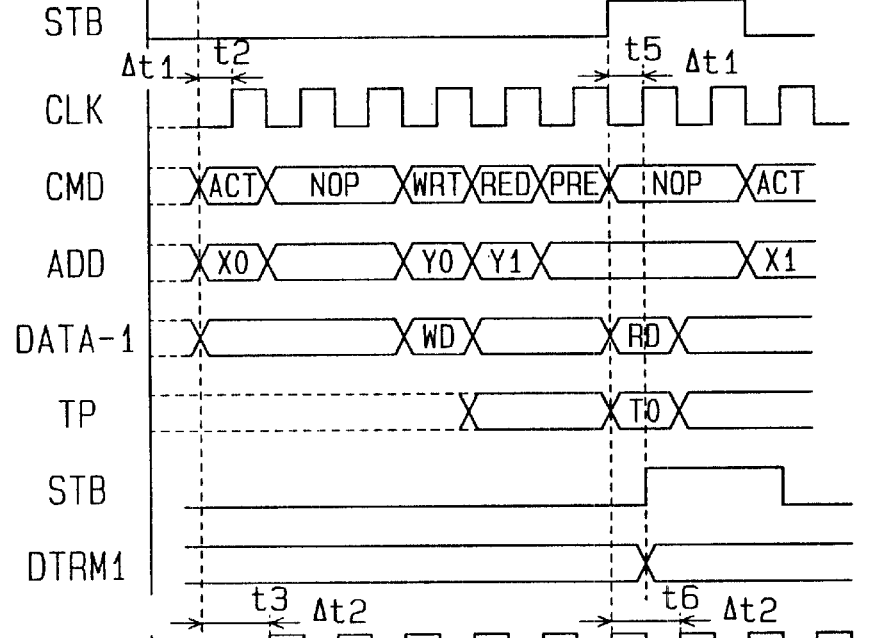
Figure 16:
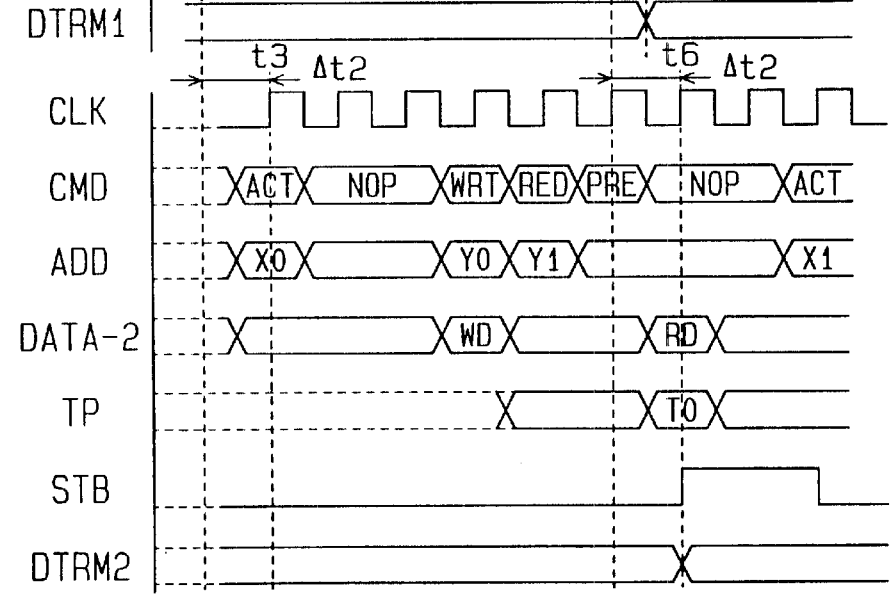

FIG. 15 is a block diagram of the comparison/determination circuit 86.

The comparison/determination circuit 86 includes an XOR circuit 91 and a D flip-flop (FF) circuit 92. The XOR circuit 91 compares the read data DATA-1 with the expected value data TP, and provides a signal S1 having a level corresponding to the comparison result to the FF circuit 92.

The FF circuit 92 receives the comparison timing signal STB at its clock input terminal and the signal S1 at its data terminal. The FF circuit 92 latches the signal S1 in response to the rising edge of the comparison timing signal STB and outputs a comparison/determination signal DTRM1 having a latched level of the signal S1.

The memory circuit 87 stores the write data DATA-2 as cell information in response to the control signal (CMD, ADD, CLK), and provides to the comparison/determination circuit 88 read data DATA-2 having the cell information read in response to the control signal (CMD, ADD, CLK). The comparison/determination circuit 88 latches the result of a comparison made between the expected data TP and the read data DATA-2 in response to the comparison timing signal STB, and outputs a determination signal DTRM2 having the latched level.

This allows the semiconductor device 81 to be tested using a testing apparatus whose operating frequency (specifically, the frequency of a clock signal CLK) is lower than that of the semiconductor device 81. That is, the comparison/determination circuits 86 and 87 latch read data DATA-1 and read data DATA-2 in response to a comparison timing signal STB during a period in which these pieces of data are valid, respectively. Therefore, if the frequency of the comparison timing signal STB is made lower, the levels of the comparison/determination signals DTRM1 and DTRM2 can be held to the next comparison time, and thus even a slow testing apparatus can reliably receive the comparison/determination signals DTRM1 and DTRM2.

Next, the operation of the semiconductor device will be described in accordance with FIGS. 16(a) to 16(c). FIG. 16(a) is a waveform chart at the input/output terminals of the test section 84; FIG. 16(b) is a waveform chart at the input/output terminals of the first memory section 82; and FIG. 16(c) is a waveform chart at the input/output terminals of the second memory section 83.

Now, the test section 84 outputs a control signal CMD for a command "ACT" in synchronism with a clock signal CLK at time t1. The first memory section 82 receives the signal CMD at time t2, which is Δt1 past time t1, and the second memory section 83 receives the same signal at time t3, which is Δt2 past time t1. The first and second memory sections 82 and 83 operate in response to the received command.

Next, the test section 84 outputs to both memory sections 82 and 83 a control signal CMD corresponding to a read command "RED" in synchronism with a clock signal CLK. Then, the test section 84 outputs expected value data TP having a value "T0" to both memory sections 82 and 83 after a predetermined time period (two clock cycles in FIG. 16) corresponding to the operations of the memory circuits 85 and 87 has elapsed.

Each of the expected value data signals output from the test section 84 has a delay (Δt1 or Δt2) corresponding to each of the wire lengths and reaches each of the first and second memory sections 82 and 83. The memory circuit 85 of the first memory section 82 provides, in synchronism with a clock signal CLK, read data RDAT-1 based on the cell information read in response to the command "RED". The memory circuit 87 of the second memory section 83 provides, in synchronism with the clock signal CLK, read data RDAT-2 based on the cell information read in response to the command "RED".

Next, at time t4 after the predetermined time period has elapsed, the test section 84 causes a comparison timing signal STB to rise to H level from L level. This comparison timing signal STB is subjected to the same delays as those of the control signals CMD. That is, the first comparison/determination circuit 86 receives the rising edge of the comparison timing signal STB at time t5, which is Δt1 past time t4, and the second comparison/determination circuit 88 receives the same signal at time t6, which is Δt2 past time t4.

At time t5, the comparison/determination circuit 86 receives the read data DATA-1 and the expected value data TP. This expected value data TP is subjected to the same delay (Δt1) as that of the control signal CMD. Therefore, the time at which the circuit 86 receives the data TP is within the period in which the read data DATA-1 is valid, and thus the time at which the comparison/determination circuit 86 receives the read data DATA-1 substantially coincides with the time at which the circuit 86 receives the expected value data TP.

At time t6, the comparison/determination circuit 88 receives the read data DATA-2 and the expected value data TP. This expected value data TP is subjected to the same delay (Δt2) as that of the control signal CMD. Therefore, the time at which the circuit 88 receives the data TP is within the period in which the read data DATA-2 is valid, and thus the time at which the comparison/determination circuit 88 receives the read data DATA-2 substantially coincides with the time at which the circuit 88 receives the expected value data TP.

That is, the comparison/determination circuit 86 of the first memory section 82 latches the comparison result between the expected value data TP and the read data DATA-1 at time t5, and the comparison/determination circuit 88 of the second memory section 83 latches the comparison result between the expected value data TP and the read data DATA-2 at time t6. Therefore, the testing apparatus receives determination signals DTRM1 and DTRM2 that have the levels at which the comparison results are latched at an appropriate time after time t6.

Thus, the test section 84 tests the first memory section 82 and the second memory section 83 at the same time, and even if the testing apparatus operates more slowly than the semiconductor device 81, the testing apparatus reliably receives the comparison/determination results.

As described above, the second embodiment provides the following advantages.

(1) The time at which the comparison/determination circuits 86 and 88 receive expected value data TP substantially coincide with the time at which the circuits 86 and 88 receive read data DATA-1 and read data DATA-2. Further, the test section 84 supplies the comparison/determination circuits 86 and 88 with a comparison timing signal STB, and the comparison/determination circuits 86 and 88 latch and update the comparison results in response to the rising edge of the comparison timing signal STB, and output determination signals DTRM1 and DTRM2 having the levels at which the results are latched. As a result, the test section 84 tests the first memory section 82 and the second memory section 83 at the same time, and even if a testing apparatus operates more slowly than the semiconductor device 81, the testing apparatus reliably receives the comparison/determination results.

Third Embodiment

Figure 19:
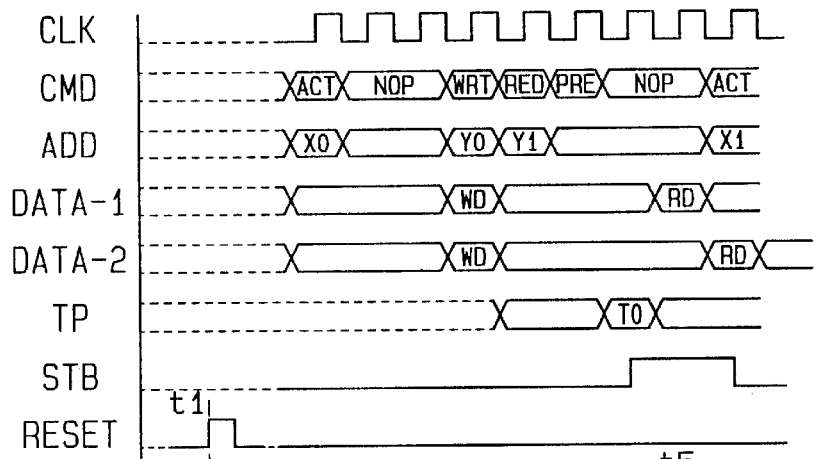
FIGS. 19(a) to 19(c) are timing charts of the semiconductor device of FIG. 17.
Figure 19:
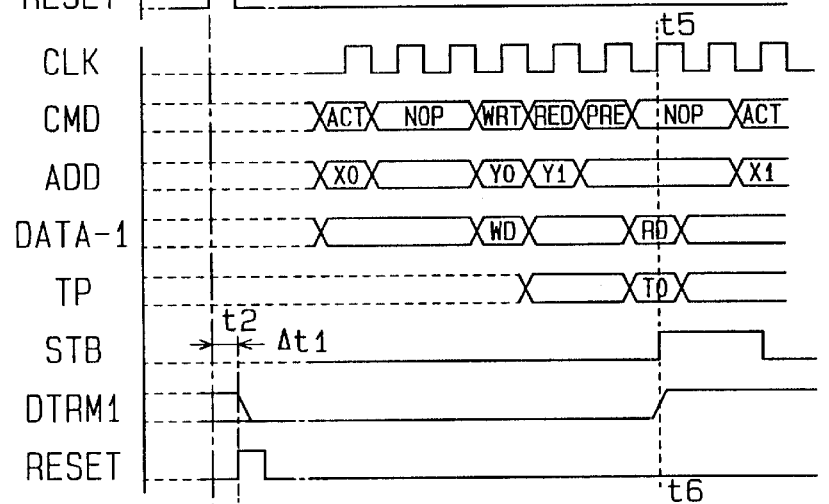
Figure 19:
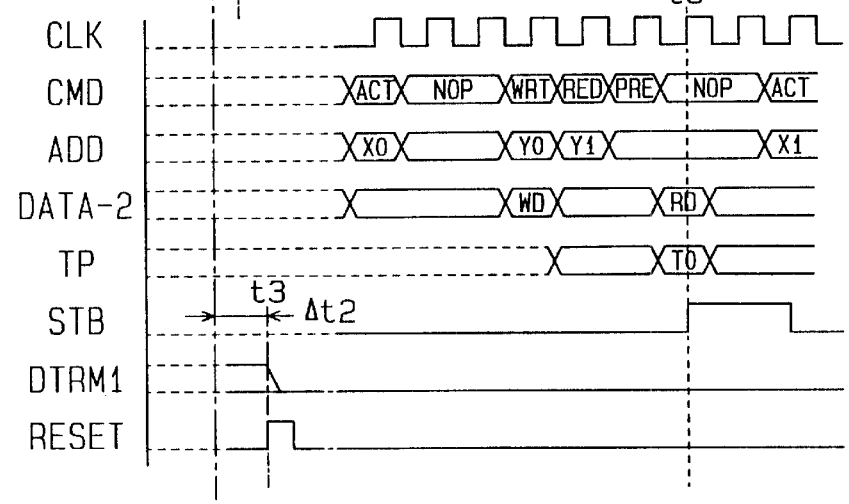

A semiconductor device 101 according to a third embodiment of the present invention will be described in accordance with FIGS. 17 to 19. FIG. 17 is a partial block diagram of the semiconductor device 101. The semiconductor device 101 includes two memory sections 102 and 103 and a test section 104, and these components are formed on one chip together with logic circuits (not shown).

The memory section 102 includes a memory circuit 105 and a comparison/determination circuit 106, and the memory section 103 includes a memory circuit 107 and a comparison/determination circuit 108. The memory circuits 105 and 107 have substantially the same functions as those of the memory circuits 85 and 87 of the second embodiment.

The test section 104 further generates a reset signal RESET. The test section 104 receives a test mode signal from a testing apparatus (not shown), and outputs a reset signal RESET before starting to test the memory sections 102 and 103. The comparison/determination circuits 106 and 108 reset the comparison results in response to the reset signal RESET, and output comparison/determination signals DTRM1 and DTRM2 having a level corresponding to the reset state (L level in the third embodiment).

Next, the test section 104 starts testing the memory sections 102 and 103. That is, the test section 104 provides to the memory sections 102 and 103 a control signal (CMD, ADD, CLK), expected value data TP, a comparison timing signal STB, and a reset signal RESET. Further, the test section 104 provides write data DATA-1 to the first memory section 102 and write data DATA-2 to the second memory section 103.

The comparison/determination circuit 106 of the first memory section 102 receives the comparison timing signal STB and expected value data TP, compares the expected value data TP with read data DATA-1, latches the comparison result in accordance with the comparison timing signal STB, and outputs a determination signal DTRM1 having a level at which the result is latched. Further, once the comparison/determination circuit 106 latches a determination signal DTRM1 having an H level (Fail), the circuit 106 holds that level.

FIG. 18 is a schematic diagram of the comparison/determination circuit 106.

The comparison/determination circuit 106 includes an XOR circuit 111, an OR circuit 112, and a D flip-flop (FF) circuit 113. The XOR circuit 111 compares the read data DATA-1 with the expected value data TP, and provides a signal S1 having a level corresponding to the comparison result to the OR circuit 112.

The signal S1 and the comparison/determination signal DTRM1 are provided to the OR circuit 112, and the circuit 112 provides a signal S2 generated by ORing these signals S1 and DTRM1 to the FF circuit 113.

The FF circuit 113 receives the comparison timing signal STB at its clock input terminal, the signal S1 at its data terminal, and the reset signal RESET at its clear terminal.

The FF circuit 113 outputs an L-level comparison/determination signal DTRM1 in response to the rising edge of the reset signal RESET. The FF circuit 113 outputs a comparison/determination signal DTRM1 having a level at which the signal S1 is latched in response to the rising edge of the comparison timing signal STB. This comparison/determination signal DTRM1 is provided to the OR circuit 112.

When the read data DATA-1 of the memory circuit 105 does not coincide with the expected value data TP, the comparison/determination signal DTRM1 goes high, and thus the OR circuit 112 outputs an H-level signal S2. As a result, the comparison/determination circuit 106 holds the determination signal DTRM1 at H level.

The comparison/determination circuit 108 latches the comparison result between the expected value data TP and read data DATA-2 in response to the comparison timing signal STB, and outputs a determination signal DTRM2 having the latched level. Further, once the comparison/determination circuit 108 latches a determination signal DTRM2 having an H level (Fail), the circuit 108 holds that level.

The semiconductor device 101 is advantageous in conducting, for example, a process test for determining only whether the whole chip passes or fails. That is, a testing apparatus sequentially conducts a plurality of operation tests for each of a plurality of semiconductor devices 101.

The semiconductor device 101 outputs the H-level determination signals DTRM1 and DTRM2 indicating that the device 101 "fails." Therefore, the testing apparatus checks a semiconductor device 101 that has passed all the operation tests easily based on the levels of the determination signals DTRM1 and DTRM2 when all of the operation tests have been completed for such semiconductor device.

Further, it is preferable that the testing apparatus receives a result obtained by ORing the determination signals DTRM1 and DTRM2. This allows the testing apparatus to have a smaller number of terminals for receiving the determination results.

Next, the operation of the semiconductor device 101 will be described in accordance with FIGS. 19(a) to 19(c). FIG. 19(a) is a waveform chart at the input/output terminals of the test section 104; FIG. 19(b) is a waveform chart at the input/output terminals of the first memory section 102; and FIG. 19(c) is a waveform chart at the input/output terminals of the second memory section 103.

Now, the test section 104 changes a reset signal RESET from L level to H level at time t1. The comparison/determination circuits 106 and 108 reset their determination signals DTRM1 and DTRM2 in response to the H-level reset signal RESET.

Next, the test section 104 outputs a control signal CMD for a command "ACT" in synchronism with a clock signal CLK. The first memory section 102 receives the signal CMD at time t2, which is $\Delta t1$ past time t1, and the second memory section 103 receives the signal CMD at time t3, which is $\Delta t2$ past time t1. The first and second memory sections 102 and 103 operate in response to the received command.

Next, the test section 104 provides to both memory sections 102 and 103 a control signal CMD corresponding to a read command "RED" in synchronism with a clock signal CLK. The test section 104 provides expected value data TP having a value "T0" to both memory sections 102 and 103 after a predetermined time period (two clock cycles in FIG. 19) corresponding to the operations of both memory circuits 105 and 107 has elapsed.

Each of the expected value data signals output from the test section 104 has a delay ($\Delta t1$ or $\Delta t2$) corresponding to each of the wire lengths and reaches each of the first and second memory sections 102 and 103. The memory circuit 105 outputs, in synchronism with a clock signal CLK, read data DATA-1 based on the cell information read in response to the command "RED". The memory circuit 107 outputs, in synchronism with the clock signal CLK, read data DATA-2 based on the cell information read in response to the command "RED".

Next, the test section 104 causes the comparison timing signal STB to rise to H level from L level. The comparison timing signal STB has the same delay as the control signals CMD. That is, the first comparison/determination circuit 106 receives the comparison timing signal STB at time t5, and the second comparison/determination circuit 108 receives the same at time t6.

At time t5, the comparison/determination circuit 106 latches the comparison result between the read data DATA-1 and the expected value data TP in response to the comparison timing signal STB. In FIG. 19(b), the comparison/determination circuit 106 outputs a latched determination signal DTRM1 having an H level, and holds that level.

At time t6, the comparison/determination circuit 108 latches the comparison result between the read data DATA-2 and the expected value data TP in response to the comparison timing signal STB. In FIG. 19(c), the comparison/determination circuit 108 outputs a latched L-level determination signal DTRM2, As described above, the third embodiment provides the following advantages.

(1) The time at which the comparison/determination circuits 106 and 108 receive the expected value data TP substantially coincides with the time at which the circuits 106 and 108 receive the read data DATA-1 and the read data DATA-2. Further, the comparison/determination circuits 106 and 108 reset the comparison results in response to the reset signal RESET supplied from the test section 104 before testing, and once the circuits 106 and 108 latch, in accordance with the comparison timing signal STB, H-level determination signals DTRM1 and DTRM2 indicating "Fail," the circuits 106 and 108 hold these signals DTRM1 and DTRM2 thereafter. Therefore, a semiconductor device 101 that has passed all the operation tests is easily checked after all the tests have been completed for the semiconductor device, such as in a process test.

(2) By designing a testing apparatus so that the apparatus receives the results obtained by ORing the determination signals DTRM1 and DTRM2, the testing apparatus may have a smaller number of terminals for receiving the determination results.

Fourth Embodiment

Figure 20:
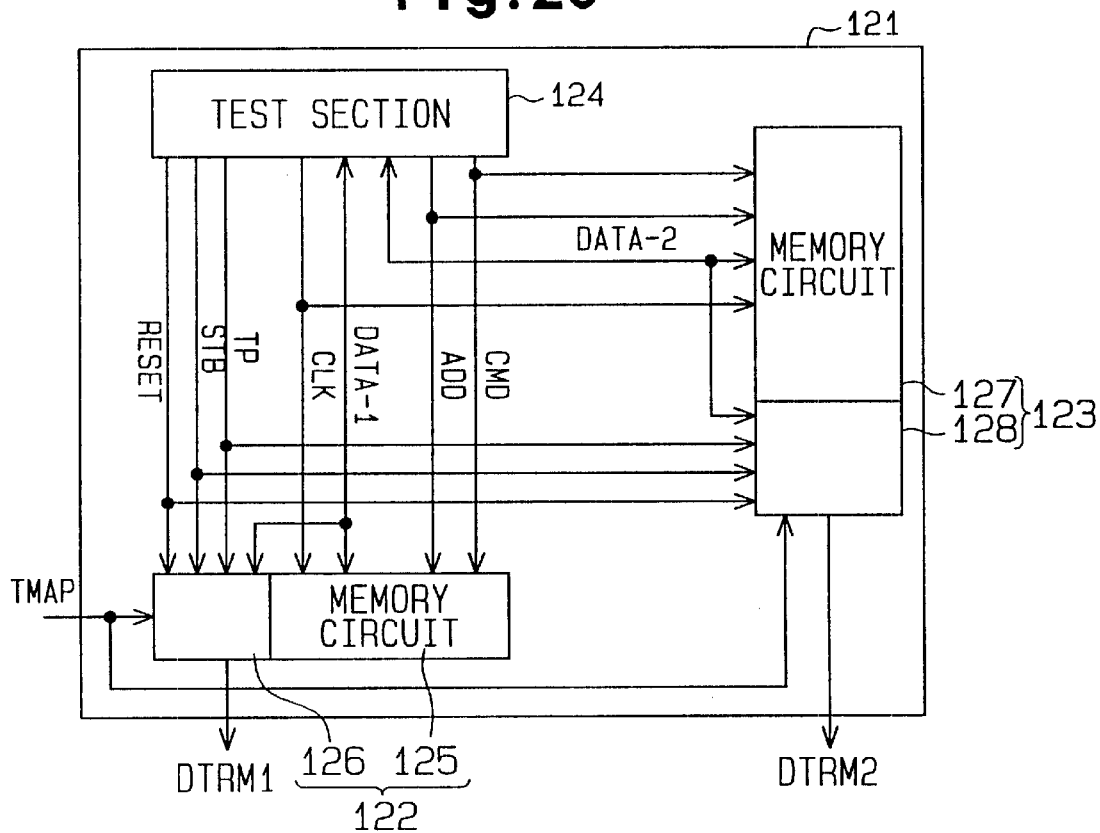
FIG. 20 is a schematic block diagram of a semiconductor device according to a fourth embodiment of the present invention.

A semiconductor device 121 according to a fourth embodiment of the present invention will be described in accordance with FIGS. 20 and 21. FIG. 20 is a partial block circuit diagram of a semiconductor device 121.

The semiconductor device 121 includes two memory sections 122 and 123 and a test section 124, and these components are formed on one chip together with logic circuits (not shown).

The test section 124 has substantially the same functions as those of the test section 104 of the third embodiment. The memory section 122 includes a memory circuit 125 and a comparison/determination circuit 126, and the memory section 123 includes a memory circuit 127 and a comparison/determination circuit 128. The memory circuits 125 and 127 have substantially the same functions as those of the memory circuits 85 and 87 of the second embodiment.

The comparison/determination circuit 126 updates a determination signal DTRM1 at every comparison time and holds an H-level determination signal DTRM1 in response to a switching signal TMAP from an external apparatus (not shown).

The comparison/determination circuit 126 latches and updates a determination signal DTRM1 at every comparison time in response to an H-level switching signal TMAP. That is, the comparison/determination circuit 126 functions similar to the comparison/determination circuit 86 of the second embodiment. As a result, the comparison/determination circuit 126 outputs a determination signal DTRM1 having a level corresponding to the Pass or Fail level at the time of outputting a comparison timing signal STB. By synchronizing the comparison timing signal STB with an operation test item, whether a semiconductor device passes or fails is checked at every comparison time.

On the other hand, once the comparison/determination circuit 126 holds an H-level determination signal DTRM1 in response to an L-level switching signal TMAP. That is, the comparison/determination circuit 126 functions similar to the comparison/determination circuit 106 of the third embodiment. As a result, once the comparison/determination circuit 126 outputs the H-level determination signal DTRM1, the circuit 126 holds such signal DTRM1. As a result, whether the memory circuit 125 (i.e., the semiconductor device 121) passes or fails is easily determined.

Figure 21:
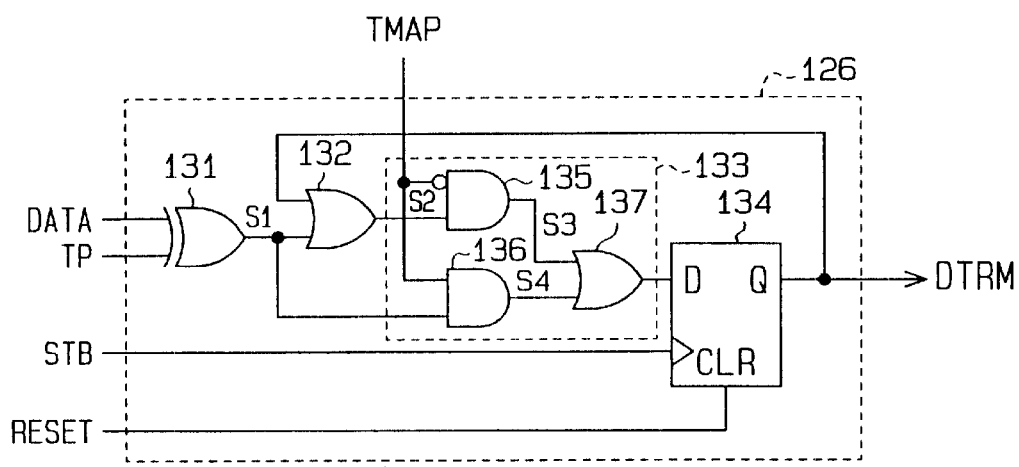
FIG. 21 is a schematic diagram of a comparison/determination circuit of the semiconductor device of FIG. 20.

FIG. 21 is a circuit diagram of the comparison/determination circuit 126.

The comparison/determination circuit 126 includes an XOR circuit 131, an OR circuit 132, a switching circuit 133, and a D flip-flop (FF) circuit 134. The XOR circuit 131 compares read data DATA-1 with expected value data TP, and provides a signal S1 having a level corresponding to the comparison result to the OR circuit 132. The signal S1 and the comparison/determination signal DTRM1 are provided to the OR circuit 132, and the OR circuit 132 provides a signal S2 generated by ORing these signals S1 and DTRM1 to the switching circuit 133.

The switching circuit 133 includes AND circuits 135 and 136, and an OR circuit 137. The AND circuit 135 receives a switching signal TMAP at an inverting input terminal, and the signal S2 at a noninverting input terminal. The AND circuit 135 outputs a signal having the same level as that of the signal S2 in response to an L-level switching signal TMAP. The switching signal TMAP and the signal S1 are provided to the AND circuit 136, and the circuit 136 outputs a signal having the same level as that of the signal S1 in response to an H-level switching signal TMAP.

The OR circuit 137 provides to the FF circuit 134 a signal obtained by ORing the output signal of the AND circuit 135 and the output signal of the AND circuit 136. As a result, the switching circuit 133 provides the signal S1 or the signal S2 to the FF circuit 134 in accordance with the level of the switching signal TMAP.

The FF circuit 134 receives the comparison timing signal STB at its clock input terminal, the output signal of the switching circuit 133 at its data terminal, and the reset signal RESET at its clear terminal. The FF circuit 134 outputs an L-level comparison/determination signal DTRM1 in response to the rising edge of the reset signal RESET. The FF circuit 134 outputs a comparison/determination signal DTRM1 having a level at which the signal S1 is latched in response to the rising edge of the comparison timing signal STB. This comparison/determination signal DTRM1 is provided to the OR circuit 132.

Therefore, the comparison/determination circuit 126 has substantially the same construction as that of the comparison/determination circuit 86 of the second embodiment by the H-level switching signal TMAP. Further, the comparison/determination circuit 126 has substantially the same construction as that of the comparison/determination circuit 106 of the third embodiment by the L-level switching signal TMAP.

The comparison/determination circuit 128 of the second memory section 123 latches the comparison result between the expected value data TP and read data DATA-2 in response to the comparison timing signal STB, and outputs a determination signal DTRM2 having the latched level.

As described above, the third embodiment provides the following advantages.

(1) The time at which the comparison/determination circuits 126 and 128 receive the expected value data TP substantially coincide with the time at which the circuits 126 and 128 receive the read data DATA-1 and the read data DATA-2. Further, by using the switching circuit 133, a testing apparatus that operates more slowly than the semiconductor device 121 can easily switch from one determination mode to the other. That is, the testing apparatus switches between one mode in which whether the device 121 passes or fails is determined at every comparison time (on an operation test item basis) and another mode in which whether the device 121 passes or fails is determined on a whole device basis.

Fifth Embodiment

Figure 22:
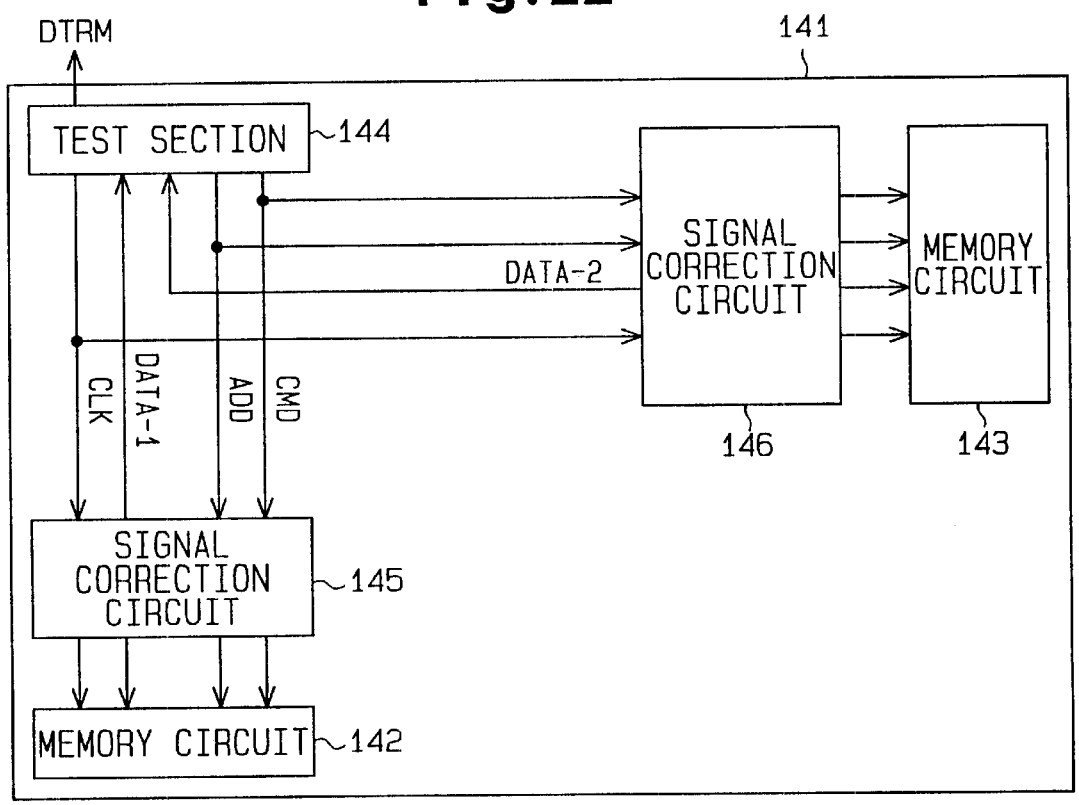
FIG. 22 is a block diagram of a semiconductor device according to a fifth embodiment of the present invention.

A semiconductor device 141 according to a fifth embodiment of the present invention will be described in accordance with FIGS. 22 to 24. FIG. 22 is a partial block diagram of the semiconductor device 141.

The semiconductor device 141 includes two memory circuits 142 and 143, a single test section 144 for testing the circuits 142 and 143, and signal correction circuits 145 and 146 corresponding to the memory circuits 142 and 143 on a one-to-one basis. These components are formed on one chip together with logic circuits (not shown).

Each of the memory circuits 142 and 143 has an input/output interface whose construction is analogous to that of an SDRAM, and uses a single terminal for both inputting and outputting data. Therefore, the memory circuits 142 and 143 are connected to the test section 144 through separate bus lines (wirings for signals DATA-1 and DATA-2 in FIG. 22). Note that write data and read data are described while denoted by the same reference character since a single terminal is used for both inputting and outputting data in the fifth embodiment.

The test section 144 generates a control signal (including a command control signal CMD, an address signal ADD, and a clock signal CLK), generates write data DATA-1 and write data DATA-2, and outputs a determination signal DTRM generated by comparing read data DATA-1 and read data DATA-2 with expected value data.

The test section 144 receives a test mode signal from a testing apparatus (not shown), and provides to the memory circuits 142 and 143 a control signal (including a command control signal CMD, an address signal ADD, and a clock signal CLK) generated in response to the test mode signal. Further, the test section 144 provides write data DATA-1 to the first memory circuit 142 and write data DATA-2 to the second memory circuit 143.

The first memory circuit 142 receives a control signal (CMD, ADD, CLK) and the write data DATA-1, and stores the write data DATA-1 as cell information. Further, the memory circuit 142 provides to the test section 144 read data DATA-1 having the cell information read in response to a control signal (CMD, ADD, CLK).

The second memory circuit 143 has substantially the same construction as that of the first memory circuit 142. The circuit 143 stores the write data DATA-2 as cell information in response to the control signal (CMD, ADD, CLK), and provides to the test section 144 read data DATA-2 having the cell information read in response to the control signal (CMD, ADD, CLK).

The test section 144 receives the read data DATA-1 and the read data DATA-2 from both memory circuits 142 and 143, and outputs a determination signal DTRM generated by comparing the read data DATA-1 and the read data DATA-2 with the expected value data.

The signal correction circuits 145 and 146 correct a signal between the test section 144 and the memory circuit 142 and a signal between the test section 144 and the memory circuit 143 so that the read data DATA-1 and the read data DATA-2 reach the test section 144 substantially simultaneously. As a result, the test section 144 receives the read data DATA-1 and the read data DATA-2 substantially simultaneously, and thus the operations of the memory circuits 142 and 143 are determined simultaneously.

More specifically, the signal correction circuits 145 and 146 add predetermined delay times to each of the signals supplied to the memory circuits 142 and 143 from the test section 144. The predetermined delay times have values based on delay times respectively generated between the test section 144 and the memory circuit 142 and between the test section 144 and the memory circuit 143.

Now let $\Delta t1$ be a delay time of a signal supplied to the first memory circuit 142 from the test section 144 and let $\Delta t2$ be a delay time of a signal supplied to the second memory circuit 143 from the test section 144. Since the distance between the test section 144 and the second memory circuit 143 is larger than the distance between the test section 144 and the first memory circuit 142, the first delay time $\Delta t1$ is shorter than the second delay time $\Delta t2$.

That is, when the test section 144 sends a read command to the first and second memory circuits 142 and 143, the second memory circuit 143 receives the command with a lag equal to a time period ($\Delta t2-\Delta t1$) from the time when the first memory circuit 142 receives the command. When both memory circuits 142 and 143 send the read data DATA-1 and the read data DATA-2 in response to the received command, respectively, the test section 144 receives the second read data DATA-2 with a lag equal to a time period (($\Delta t2-\Delta t1)\times 2$) from the time when the test section 144 receives the first read data DATA-1.

Therefore, the signal supplied to the first memory circuit 142 is given a delay equal to a difference (($\Delta t2-\Delta t1)\times 2$) between the time when the test section 144 receives the read data DATA-1 and the time when the test section 144 receives the second read data DATA-2. That is, the first signal correction circuit 145 gives a delay (($\Delta t2-\Delta t1)\times 2$) to a signal supplied to the first memory circuit 142 from the test section 144, while the second signal correction circuit 146 gives no delay to the signal supplied to the second memory circuit 143 from the test section 144. As a result, the time at which the test section 144 receives the read data DATA-1 substantially coincides with the time at which the section 144 receives the read data DATA-2, and thus the test section 144 performs the determination processes for the first and second memory circuits 142 and 143 based on both read data DATA-1 and read data DATA-2 simultaneously.

Next, the signal correction circuit 145 will be described.

Figure 23:
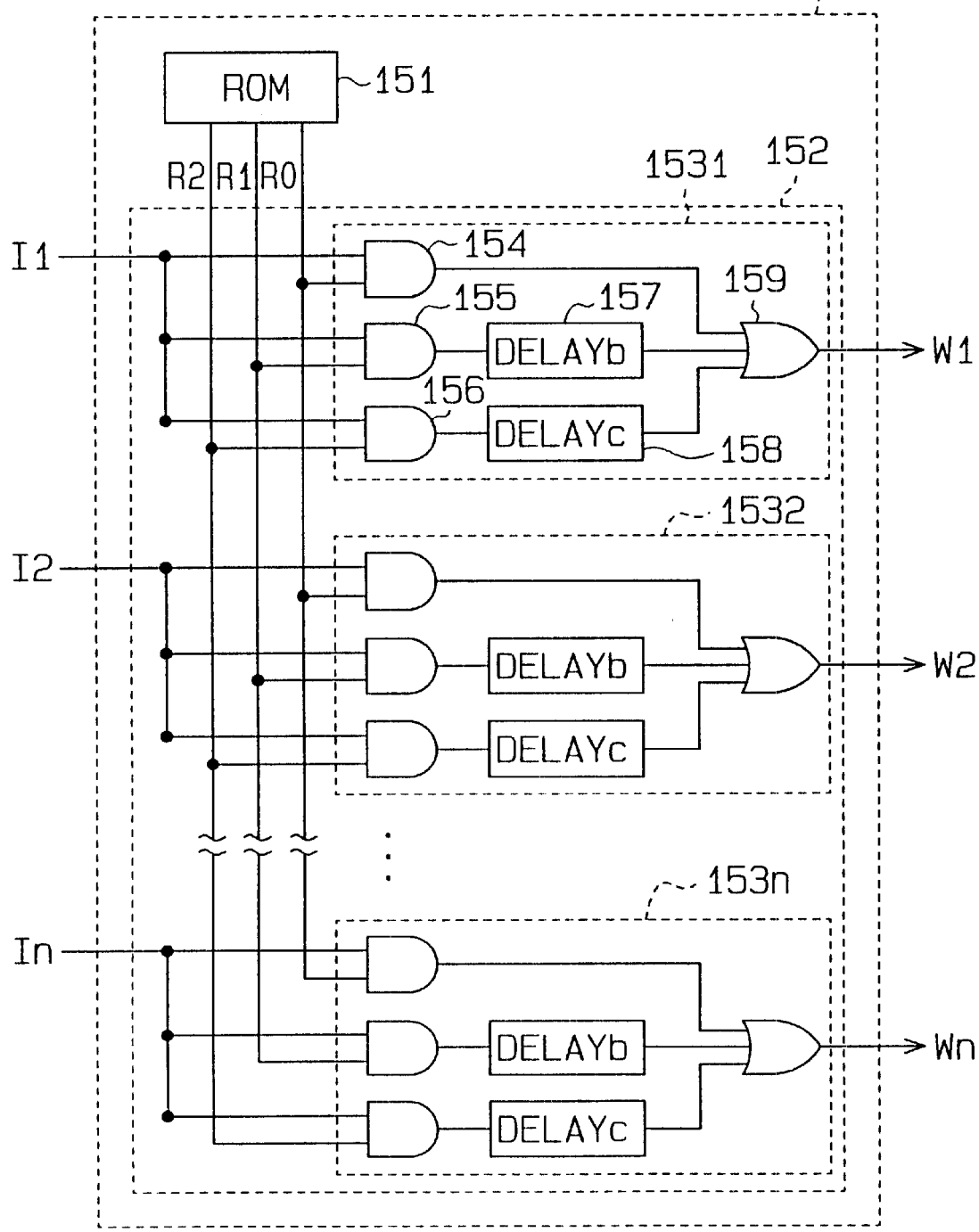
FIG. 23 is a schematic diagram of a signal correction circuit of the semiconductor device of FIG. 22.
Figure 24:
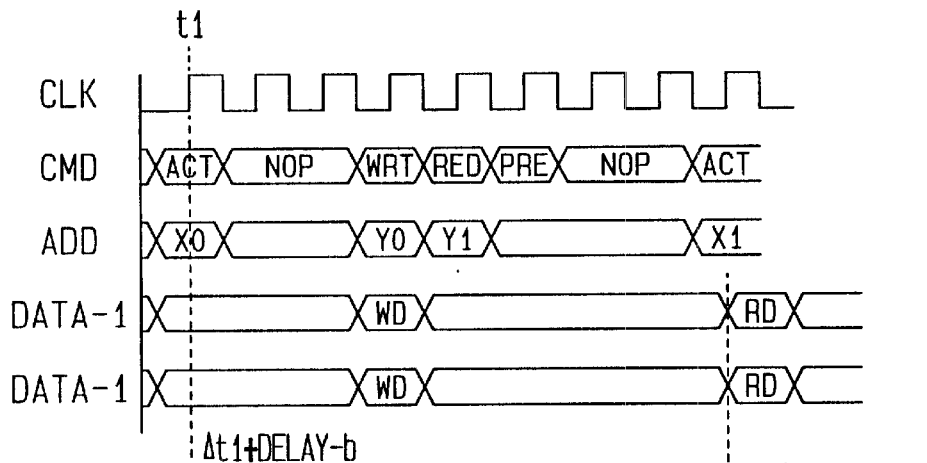
FIGS. 24(a) to 24(c) are timing charts of the semiconductor device of FIG. 22.
Figure 24:
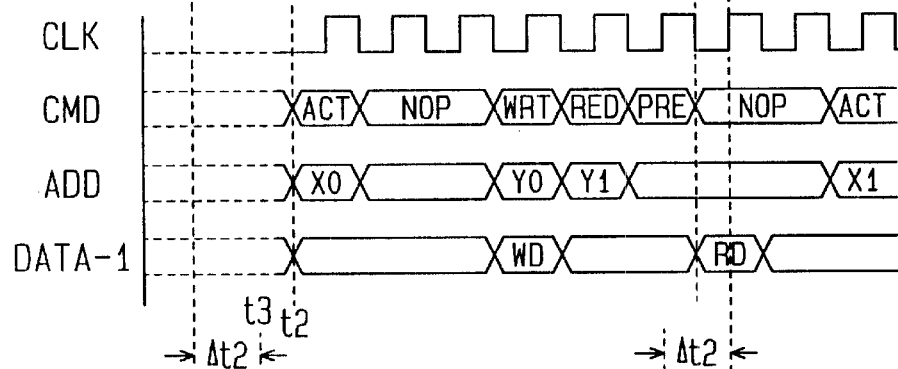
Figure 24:
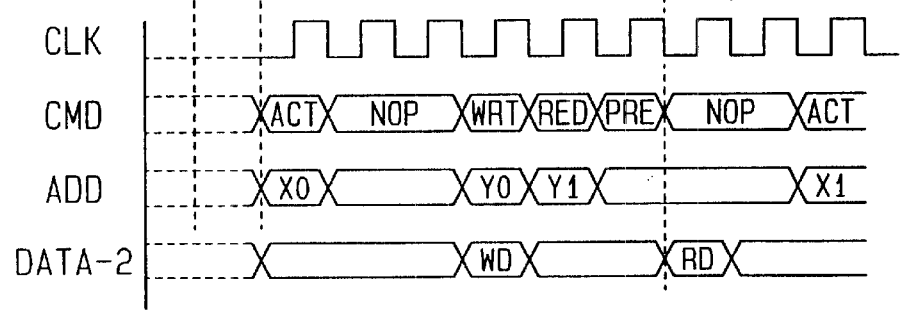

FIG. 23 is a circuit diagram of the signal correction circuit 145. Note that the signal correction circuit 146 (FIG. 22) has substantially the same construction as that of the signal correction circuit 145, and thus its drawing and detailed description will be omitted.

The signal correction circuit 145 has a ROM 151 that serves as a storage section, and a delay giving section 152. The ROM 151 stores a value corresponding to a delay time to be added to a signal, and provides to the delay giving section 152 a plurality (three bits in the fifth embodiment) of selection signals R2, R1 and R0 having levels based on that value.

A plurality of input signals I1 to In (n is a natural number and is equal to the number of signals to be corrected by the signal correction circuit 145) are provided to the delay giving section 152. The input signals I1 to In are equivalent to the command control signal CMD of FIG. 22.

The delay giving section 152 outputs corrected (delayed) signals W1 to Wn obtained by correcting the input signals I1 to In based on the selection signals R2, R1 and R0. These output signals W1 to Wn are supplied to the memory circuit 142 of FIG. 22.

The delay giving section 152 has n delay selection sections 1531 to 153n corresponding to the input signals I1 to In. Since the delay selection sections 1531 to 153n have the same construction, the delay selection section 1531 represents the others with its reference numeral, and the reference numerals of the rest of the delay selection sections 1532 to 153n will be omitted.

The delay selection section 1531 includes AND circuits 154, 155 and 156, delay circuits 157 and 158, and an OR circuit 159. The input signal I1 and the selection signal R0 are provided to the first AND circuit 154, and the output terminal of the circuit 154 is connected to the OR circuit 159. The input signal I1 and the selection signal R1 are provided to the second AND circuit 155, and the output terminal of the circuit 155 is connected to the OR circuit 159 through the first delay circuit 157. The input signal I1 and the selection signal R2 are provided to the third AND circuit 156, and the output terminal of the circuit 156 is connected to the OR circuit 159 through the second delay circuit 158.

The first and second delay circuits 157 and 158 give delay times DELAYb and DELAYc whose values are different to a signal. Therefore, the delay selection section 1531 gives the input signal I1 the delay times "0," DELAYb and DELAYc in accordance with the selection signals R0, R1 and R2.

Note that the delay time DELAYb is set to ($\Delta t2-\Delta t1$)×2 in the fifth embodiment. Therefore, the ROM 151 outputs the selection signals R0, R1, and R2 (R0=L, R1=H, R2=L) so that the delay time DELAYb is selected. As a result, the input signal I1 is given the delay time DELAYb by the first delay circuit 157 through the AND circuit 155, and is output as the signal W1.

Next, the operation of the semiconductor device 141 will be described in accordance with FIGS. 24(a)–24(c).

FIG. 24(a) is a waveform chart at the input/output terminals of the test section 144; FIG. 24(b) is a waveform chart at the input/output terminals of the first memory circuit 142; and FIG. 24(c) is a waveform chart at the input/output terminals of the second memory circuit 143.

Now, the test section 144 outputs a control signal CMD for a command "ACT" in synchronism with a clock signal CLK at time t1.

The first signal correction circuit 145 gives the signal output from the test section 144 the delay time DELAYb, and outputs the delayed signal to the first memory circuit 142. As a result, the first memory circuit 142 receives the signal at time t2, which is ($\Delta t1$+DELAYb) past time t1.

The second signal correction circuit 146 gives no delay to the signal output from the test section 144. As a result, the second memory circuit 143 receives the signal at time t3, which is $\Delta t2$ past time t1.

The first and second memory circuits 142 and 143 operate in response to the received command.

Next, the test section 144 provides a control signal CMD corresponding to a read command "RED" to both memory circuits 142 and 143 in synchronism with a clock signal CLK.

The signal output from the test section 144 has the delays corresponding to the wire lengths ($\Delta t1$, $\Delta t2$) and the delays (DELAYb, 0) given by the signal correction circuits 145 and 146 and reaches the first and second memory circuits 142 and 143.

The first memory circuit 142 outputs, in synchronism with a clock signal CLK, read data DATA-1 based on the cell information read in response to the received command "RED". The second memory circuit 143 outputs, in synchronism with the clock signal CLK, read data DATA-2 based on the cell information read in response to the received command "RED".

The read data DATA-1 has the same delay ($\Delta t1$) as that of the control signal CMD and reaches the test section 144. The read data DATA-2 has the same delay ($\Delta t2$) as that of the control signal CMD and reaches the test section 144. As shown in FIG. 24(a), the time at which the test section 144 receives the read data DATA-1 substantially coincides with the time at which the circuit 144 receives the read data DATA-2.

Therefore, the test section 144 determines the first memory circuit 142 and the second memory circuit 143 simultaneously. Thus, the test section 144 tests the operation of the first memory circuit 142 and the operation of the second memory circuit 143 simultaneously.

As described above, the fifth embodiment provides the following way.

(1) By correcting the signal between the test section 144 and the memory circuit 142 and the signal between the test section 144 and the memory circuit 143 using the signal correction circuits 145 and 146, the time at which the test section 144 receives the read data DATA-1 from the memory circuit 142 substantially coincides with the time at which the section 144 receives the read data DATA-2 from the memory circuit 143. As a result, the test section 144 determines the operations of the memory circuits 142 and 143 simultaneously, and thus the testing time is shortened.

Note that the fifth embodiment may also be modified in the following ways.

(A) The test section 144 may correct (delay) signals received from the memory circuits 142 and 143. Further, The test section 144 may correct (delay) a signal supplied from the test section 144 and signals received from memory circuits 142 and 143.

(B) The first signal correction circuit 145 may give a delay time to a signal supplied to the first memory circuit 142, the delay time being two times the delay time Δt2 of the second memory circuit 143, and the second signal correction circuit 146 may give a delay time to a signal supplied to the second memory circuit 143, the delay time being two times the delay time Δt1 of the first memory circuit 142. Since the time at which the read data DATA-1 reaches the test section 144 substantially coincides with the time at which the read data DATA-2 reaches the test section 144 even with this arrangement, the test section 144 determines whether both memory circuits 142 and 143 pass or fail simultaneously.

It should be apparent to those skilled in the art that the present invention may be embodied in many other specific forms without departing from the spirit or scope of the invention. Particularly, it should be understood that the invention may be embodied in the following forms.

(1) The invention may be embodied in a semiconductor device having a test section that tests three or more memory circuits. The larger the number of memory circuits to be tested, the more advantageous the semiconductor device becomes. That is, even if the number of memory circuits to be tested is increased, the chip area of the semiconductor device is prevented from increasing to accommodate testing by reducing the ratio of the area occupied by the test section, and the plurality of memory circuits are tested for their operation simultaneously.

(2) A plurality of memory circuits, each having a different construction in which factors such as the number of cells, the number of input/output bits, and interface specifications differ in accordance with the specifications of a logic section that utilizes such factors, may be used.

(3) The invention may also be embodied in a semiconductor device in which a plurality of such test sections as described in each aforesaid embodiment are used. In this case, at least one of such test sections is designed to take care of at least two memory sections. That is, data about the semiconductor device includes segments in which data for generating a plurality of test sections is stored, and at least one of the segments includes a description for testing at least two memory sections.

Therefore, the present examples and embodiments are to be considered as illustrative and not restrictive and the invention is not to be limited to the details given herein, but may be modified within the scope and equivalence of the appended claims.

What is claimed is:

1. A semiconductor device comprising:
   a plurality of memory circuits; and
   a test circuit for testing the plurality of memory circuits, wherein the test circuit includes,
   a test section for controlling the plurality of memory circuits to perform a read operation and generating expected value data corresponding to read data from the plurality of memory circuits, and
   a plurality of comparison/determination circuits, connected to the test section and the plurality of memory circuits and located adjacent to the plurality of memory circuits, for comparing the read data and the expected value data and generating determination signals.

2. The device of claim 1, wherein the test section generates a control signal for performing the read operation, the control signal reaching the plurality of memory circuits at respective delay times, and wherein the test section generates the expected value data so that the expected value data reach the plurality of comparison/determination circuits at the respective delay times.

3. The device of claim 1, wherein the plurality of comparison/determination circuits hold the determination signals for a predetermined time.

4. The device of claim 1, wherein the plurality of comparison/determination circuits reset the determination signals before testing.

5. The device of claim 4, wherein each of the plurality of comparison/determination circuits holds the determination signal when the read data and the expected value data do not coincide.

6. The device of claim 1, wherein each of the plurality of comparison/determination circuits selectively switch between holding the determination signals for a predetermined time and holding the determination signal when the read data and the expected value data do not coincide.

7. A semiconductor device comprising:
   a plurality of memory circuits;
   a test circuit for testing the plurality of memory circuits, wherein the test circuit provides at least one control signal to the plurality of memory circuits, receives read data signals from the plurality of memory circuits and compares the read data signals with expected value data signals corresponding to the read data signals; and
   a plurality of signal correction circuits, connected between the plurality of memory circuits and the test circuit, for delaying the at least one control signal and at least one of the read data signals such that the read data signals reach the test circuit substantially simultaneously.

8. The device of claim 7, wherein the plurality of signal correction circuits delay the at least one control signal and at least one of the read data signals based on a difference in delay times of the at least one control signal supplied to the memory circuits.

9. The device of claim 7, wherein each of the plurality of signal correction circuits includes:
   a storage circuit for storing information about delay times of the at least one control signal; and
   a delaying circuit for delaying the at least one control signal based on the information.

10. The device of claim 7, wherein the plurality of signal correction circuits delay the at least one control signal and at least one of the read data signals based on a difference in delay times of the read data signals.

11. The device of claim 7, wherein the plurality of memory circuits includes a first memory circuit and a second memory circuit, and wherein the plurality of signal correction circuits delay the at least one control signal and at least one of the read data signals based on a difference between a first delay time between the test circuit and the first memory circuit and a second delay time between the test circuit and the second memory circuit.

12. The device of claim 7, wherein the plurality of memory circuits includes a first memory circuit for providing a first read data signal and a second memory circuit for providing a second read data signal, the plurality of signal correction circuits includes a first signal correction circuit corresponding to the first memory circuit and a second signal correction circuit corresponding to the second memory circuit, and wherein the second signal correction circuit delays the at least one control signal and the second read signal based on a first delay time between the test circuit and the first memory circuit, and the first signal correction circuit delays the at least one control signal and the first read signal based on a second delay time between the test circuit and the second memory circuit.

13. The device of claim 7, wherein the at least one control signal includes at least one of a clock signal, an address signal, and a command signal.

14. A recording medium on which hardware description language (HDL) data describing the behavior of a test circuit for testing a plurality of memory circuits is recorded, the test circuit including a test section and a plurality of comparison/determination circuits, and the HDL data including:
- a first data segment describing the behavior of the test section for controlling the plurality of memory circuits to perform a read operation, and generating expected value data corresponding to read data from the plurality of memory circuits,
- a second data segment describing the behavior of the comparison/determination circuits for comparing the read data and the expected value data and generating determination signals, and
- a third data segment describing a behavior of providing the comparison/determination circuits adjacent to corresponding memory circuits, respectively.

15. The recording medium of claim 14, wherein the test section provides a comparison timing signal to the comparison/determination circuits, and wherein the second data segment includes,
- a data segment describing the behavior of comparators for comparing the read data and the expected value data, and
- a data segment describing the behavior of latch circuits for latching the determination signals in response to the comparison timing signal.

16. The recording medium of claim 14, wherein the first data segment includes a behavior description for providing a comparison timing signal and a reset signal to the comparison/determination circuits, and wherein the second data segment includes;
- a data segment describing the behavior of comparators for comparing the read data and the expected value data; and
- a data segment describing the behavior of latch circuits for latching the determination signals in response to the comparison timing signal and a behavior description for resetting the latch circuits in response to the reset signal.

17. The recording medium of claim 14, wherein the first data segment includes a behavior description for providing a comparison timing signal to the comparison/determination circuits, and wherein the second data segment includes,
- a data segment describing the behavior of comparator for comparing the read data and the expected value data,
- a data segment describing the behavior of first latch circuits for latching and updating the determination signals in response to the comparison timing signal,
- a data segment describing the behavior of second latch circuits for latching and holding the determination signals in response to the comparison timing signal, and
- a data segment describing the behavior of switching circuits for switching between the first latch circuits and the second latch circuits in response a switching signal.

18. A recording medium on which hardware description language (HDL) data describing the behavior of a test circuit for testing a plurality of memory circuits is recorded, the HDL data including:
- a first data segment describing the behavior of the test circuit for providing at least one control signal to the plurality of memory circuits, receiving read data signals from the plurality of memory circuits and comparing the read data signals with expected value data signals corresponding to the read data signals; and
- a second data segment describing the behavior of a plurality of signal correction circuits for delaying the at least one control signal and at least one of the read data signals such that the read data signals reach the test circuit substantially simultaneously.

19. The recording medium of claim 18, wherein the second data segment includes a third data segment describing a behavior for delaying the at least one control signal and at least one of the read data signals based on a difference between delay times of the at least one control signal supplied to the memory circuits.

20. The recording medium of claim 19, wherein the second data segment includes:
- a fourth data segment describing the behavior of a storage circuit for storing information about delay times of the at least one control signal, and
- a fifth data segment describing the behavior of a delaying circuit for delaying the at least one control signal based on the information.

21. The recording medium of claim 18, wherein the second data segment further describes the behavior of the plurality of signal correction circuits for delaying the at least one control signal and at least one of the read data signals based on a difference in delay times of the read data signals.

22. The recording medium of claim 18, wherein the at least one control signal includes at least one of a clock signal, an address signal, and a command signal.

23. A recording medium on which cell data about a test circuit for testing a plurality of memory circuits is recorded, the cell data including:
- a first cell data segment of a test section for controlling the plurality of memory circuits to perform a read operation and generating expected value data corresponding to read data from the plurality of memory circuits;
- a second cell data segment of a comparison/determination circuits for comparing the read data and the expected value data and generating determination signals; and
- a third cell data segment of providing the comparison/determination circuits adjacent to the corresponding memory circuits, respectively.

24. The recording medium of claim 23, wherein the test section provides a comparison timing signal to the comparison/determination circuits, and wherein the second cell data segment includes,
- a third cell data segment of comparators for comparing the read data and the expected value data, and
- a fourth cell data segment of latch circuits for latching the determination signals in response to the comparison timing signal.

25. The recording medium of claim 23, wherein the first cell data segment includes a behavior description for providing a comparison timing signal and a reset signal to the comparison/determination circuits, and
wherein the second cell data segment includes,
- a third cell data segment of comparators for comparing the read data and the expected value data, and
- a fourth cell data segment of latch circuits for latching the determination signals in response to the comparison timing signal, and wherein the fourth cell data segment includes a behavior description for resetting the determination signals in response to the reset signal.

26. The recording medium of claim 23, wherein the first cell data segment includes a behavior description for providing a comparison timing signal to the comparison/determination circuits, and wherein the second cell data segment includes, a third cell data segment of comparators for comparing the read data and the expected value data, a fourth cell data segment of first latch circuits for latching and updating the determination signals in response to the comparison timing signal at predetermined comparison times, a fifth cell data segment of second latch circuits for latching and holding the determination signals in response to the comparison timing signal, and a sixth cell data segment of switching circuits for switching between the first latch circuits and the second latch circuits in response a switching signal.

27. A recording medium on which cell data about a test circuit for testing a plurality of memory circuits is recorded, the data including:

a first cell data segment of the test circuit for providing at least one control signal to the plurality of memory circuits, receiving read data signals from the plurality of memory circuits and comparing the read data signals with expected value data signals corresponding to the read data signals; and a second cell data segment of a plurality of signal correction circuits for delaying the at least one control signal and at least one of the read data signals such that the read data signals reach the test circuit substantially simultaneously.

28. The recording medium of claim 27, wherein the second cell data segment includes:

a third cell data segment of a storage circuit for storing information about delay times of the at least one control signal, and a fourth cell data segment of a delaying circuit for delaying the at least one control signal based on the information.

29. The recording medium of claim 27, in the second cell data segment, the plurality of signal correction circuits delay the at lest one control signal and at least one of the read data signals based on a difference in delay times of the read data signals.

30. The recording medium of claim 27, wherein the at least one control signal includes at least one of a clock signal, an address signal, and a command signal.

* * * * *